United States Patent
Nomura et al.

[11] Patent Number: 5,812,887
[45] Date of Patent: Sep. 22, 1998

[54] LENS SUPPORTING STRUCTURE

[75] Inventors: Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[21] Appl. No.: 781,601

[22] Filed: Jan. 9, 1997

[30] Foreign Application Priority Data

| Jan. 26, 1996 | [JP] | Japan | 8-012317 |
| Feb. 21, 1996 | [JP] | Japan | 8-034123 |
| Jul. 15, 1996 | [JP] | Japan | 8-184792 |

[51] Int. Cl.$^6$ .................................................. G03B 17/00
[52] U.S. Cl. ............................. 396/72; 396/85; 359/696; 359/700; 359/704
[58] Field of Search ................... 396/72, 85, 87, 396/529; 359/696, 699, 700, 701, 704

[56] References Cited

U.S. PATENT DOCUMENTS

| 4,324,457 | 4/1982 | Tomuri . | |
| 4,944,030 | 7/1990 | Haraguchi et al. . | |
| 4,974,949 | 12/1990 | Tanaka . | |
| 5,181,144 | 1/1993 | Shirie et al. . | |
| 5,231,449 | 7/1993 | Nomura . | |
| 5,245,476 | 9/1993 | Shono . | |
| 5,255,124 | 10/1993 | Iwamura | 359/700 |
| 5,262,898 | 11/1993 | Nomura | 359/700 |
| 5,307,104 | 4/1994 | Hamasaki . | |
| 5,386,740 | 2/1995 | Nomura et al. | 359/704 |
| 5,510,936 | 4/1996 | Aoki et al. . | |
| 5,535,057 | 7/1996 | Nomura et al. | 396/72 |
| 5,543,971 | 8/1996 | Nomura et al. | 359/700 |
| 5,581,411 | 12/1996 | Nomura et al. | 359/704 |
| 5,604,638 | 2/1997 | Nomura et al. | 359/704 |
| 5,636,064 | 6/1997 | Nomura et al. | 359/704 |
| 5,652,922 | 7/1997 | Kohno | 396/72 |
| 5,659,810 | 8/1997 | Nomura et al. | 396/72 |
| 5,661,609 | 8/1997 | Nomura et al. | 359/700 |

FOREIGN PATENT DOCUMENTS 2302600  1/1997  United Kingdom .

OTHER PUBLICATIONS

United Kingdom Search Report.

*Primary Examiner*—Russell E. Adams
*Attorney, Agent, or Firm*—Greenblum & Bernstein, P.L.C.

[57] ABSTRACT

A lens supporting structure for supporting a lens group in a lens barrel is disclosed. The lens supporting structure includes: a lens frame which supports the lens group therein; an outer flange formed on an outer periphery of the lens frame; an annular elastic member positioned on the lens frame immediately behind the outer flange; an inner flange formed extending inwardly on an inner periphery of the lens barrel, an inner circumferential edge of the inner flange defining an circular aperture having a center coincident with an optical axis of the lens group, the lens frame being inserted in the lens barrel through the circular aperture to be positioned in the lens barrel with the annular elastic member being compressed between the outer flange and the inner flange; a plurality of projections formed on one of the outer periphery of the lens frame and the inner edge of the inner flange; and a plurality of recesses formed on the other of the outer periphery of the lens frame and the inner edge of the inner flange, the plurality of recesses respectively engaging with the plurality of projections to secure the lens frame to the lens barrel.

11 Claims, 22 Drawing Sheets

LENS SUPPORTING STRUCTURE

BACKGROUND OF THE INVENTION

1. Field of the Invention

The present invention relates to a lens supporting structure of a photographic lens of a camera.

2. Description of the Related Art

A conventional zoom lens of a lens shutter type of camera that is provided with a front lens group and a rear lens group which are moved relative to each other along an optical axis thereof to effect zooming, is well known. Such a conventional zoom lens is provided with a lens frame which supports the front lens group therein. The lens frame is fixed, by an adhesive or set screws, to a moving barrel (lens frame supporting barrel) which is driven to advance from or retract into a camera body when a zooming operation is effected.

However, in such a zoom lens having the aforementioned structure, it is difficult to adjust the position of the front lens group relative to the rear lens group, that is, the position of the lens frame relative to the moving barrel, during assembly thereof. Specifically, when an adhesive is used for fixing the lens frame to the moving barrel it is almost impossible to readjust the position of the front lens group relative to the rear lens group once the adhesive has set.

SUMMARY OF THE INVENTION

An object of the present invention is to provide a lens supporting structure in which a lens frame, which supports a lens group therein, can be easily fixed to a lens barrel provided separate from the lens frame, and in which the position of the lens frame can be easily adjusted relative to the lens barrel.

To achieve the object mentioned above, according to an aspect of the present invention, there is provided a lens supporting structure for supporting a lens group in a lens barrel. The lens supporting structure includes: a lens frame which supports the lens group therein; an outer flange formed on an outer periphery of the lens frame; an annular elastic member positioned on the lens frame immediately behind the outer flange; an inner flange formed extending inwardly on an inner periphery of the lens barrel, an inner circumferential edge of the inner flange defining an circular aperture having a center coincident with an optical axis of the lens group, the lens frame being inserted in the lens barrel through the circular aperture to be positioned in the lens barrel with the annular elastic member being compressed between the outer flange and the inner flange; a plurality of projections formed on one of the outer periphery of the lens frame and the inner edge of the inner flange; and a plurality of recesses formed on the other of the outer periphery of the lens frame and the inner edge of the inner flange, the plurality of recesses respectively engaging with the plurality of projections to secure the lens frame to the lens barrel.

Preferably, the annular elastic member is an O-ring.

Preferably, the plurality of projections and the plurality of recesses are formed at even angular intervals about the optical axis.

Preferably, each of the plurality of recesses includes a first recess portion which allows a corresponding one of the plurality of projections to be inserted therein or taken out therefrom in a direction of the optical axis, and a second recess portion which prevents the corresponding one of the plurality of projections from disengaging therefrom, the second recess portion being connected with the first recess portion in a circumferential direction about the optical axis, so that the corresponding one of the plurality of projections positioned in the first recess portion shifts to the second recess portion when the lens frame is rotated about the optical axis relative to the lens barrel in a predetermined rotational direction.

Preferably, the plurality of projections and the plurality of recesses are formed such that a width of the second recess portion is greater than a width of the corresponding one of the plurality of projections in the direction of the optical axis.

According to another aspect of the present invention, there is provided a lens supporting structure for supporting a front lens group of a photographic lens system in a lens barrel. The lens supporting structure includes: a lens frame which supports the lens group therein; an outer flange formed on an outer periphery of the lens frame; an annular elastic member positioned on the lens frame immediately behind the outer flange; an inner flange formed extending inwardly on an inner periphery of the lens barrel, an inner circumferential edge of the inner flange defining an circular aperture having a center coincident with an optical axis of the lens group, the lens frame being inserted in the lens barrel through the circular aperture to be positioned in the lens barrel with the annular elastic member being compressed between the outer flange and the inner flange; a unit positioned in the lens barrel behind the inner flange, the unit including a rear lens group supported thereon such that the rear lens group is movable relative to the unit along the optical axis for focusing, a cylindrical space formed along the optical axis in which the lens barrel is positioned, and a supporting member which supports a rear end of the lens frame; a plurality of projections formed on one of the outer periphery of the lens frame immediately behind the outer flange and the inner edge of the inner flange; and a plurality of recesses formed on another of the outer periphery of the lens frame immediately behind the outer flange and the inner edge of the inner flange, the plurality of recesses respectively engaging with the plurality of projections to secure the lens frame to the lens barrel. Preferably, the annular elastic member is an O-ring.

The present disclosure relates to subject matter contained in Japanese Patent Applications No.8-12317 (filed on Jan. 26, 1996), No.8-34123 (filed on Feb. 21, 1996) and No.8-184792 (filed on Jul. 15, 1996) which are expressly incorporated herein by reference in their entireties.

BRIEF DESCRIPTION OF THE DRAWINGS

The invention will be described below in detail with reference to the accompanying drawings in which similar elements are indicated by similar reference numerals, and wherein.

DESCRIPTION OF THE PREFERRED EMBODIMENT

Figure 13:
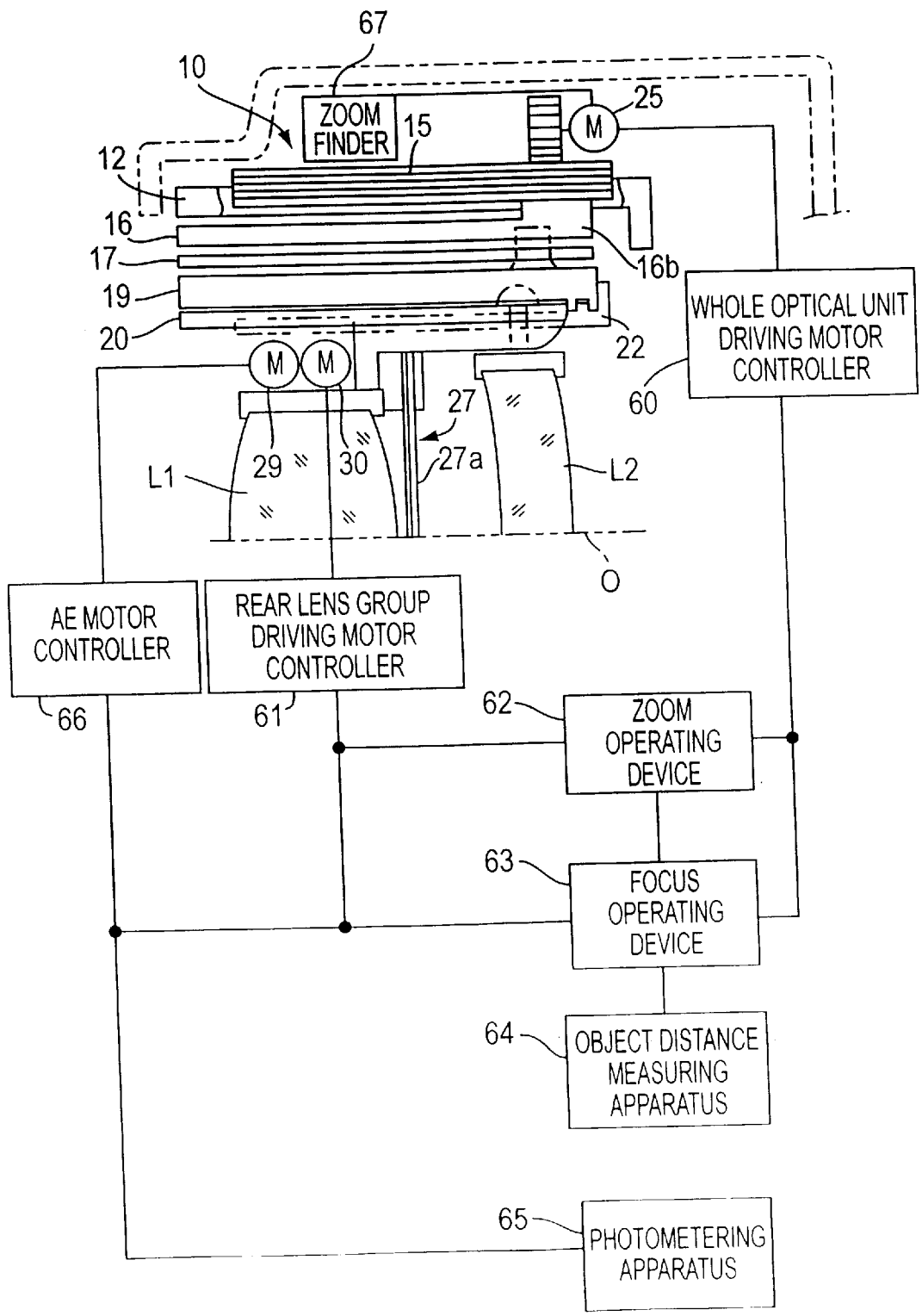
FIG. 13 is a block diagram of a controlling system for controlling an operation of the zoom lens barrel.
Figure 14:
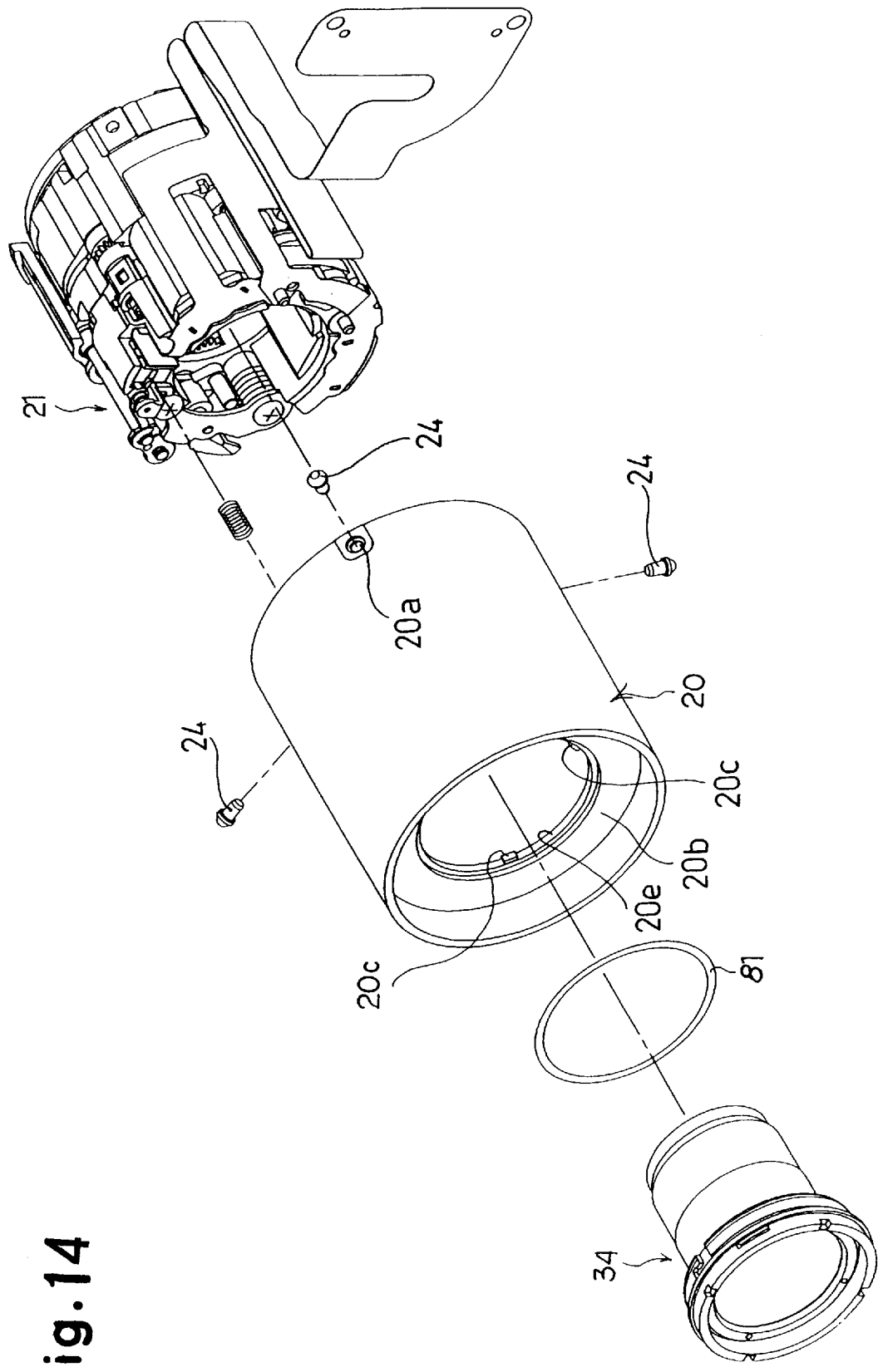
FIG. 14 is an exploded perspective view of a lens supporting barrel, an O-ring, the first moving barrel and the AF/AE shutter unit.

FIG. 13 is a schematic representation of various elements which comprise a preferred embodiment of a zoom lens camera to which the present invention is applied. A concept of the present zoom lens camera will now be described with reference to FIG. 13.

The zoom lens camera is provided with a zoom lens barrel (zoom lens) 10 of a three-stage delivery type (telescoping type) having three moving barrels, namely a first moving barrel (lens frame supporting barrel) 20, a second moving barrel 19 and a third moving barrel 16, which are concentrically arranged in this order from an optical axis O. In the zoom lens barrel 10 two lens groups are provided as a photographic optical system, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used. Similarly, a photometering system as disclosed in the above-noted U.S. patent application Ser. No. 08/605,759 could be implemented as photometering apparatus 65.

The zoom operating device 62 can be provided in the form of, for example, a manually-operable zoom operating lever (not shown) provided on the camera body or a pair of zoom buttons, e.g., a "wide" zoom button and a "tele" zoom button, (not shown) provided on the camera body. When the zoom operating device 62 is operated, the whole optical unit driving motor controller 60 drives a whole optical unit driving motor 25 to move the front lens group L1 and the rear lens group L2, rearwardly or forwardly without regard to a focal length and a focal point thereof. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies in sequence with the variation of the focal length through the operation of the zoom operating device 62. Therefore, the photographer can perceive the variation of the focal length by observing the variation of image magnification of the visual field of the finder. In addition, the focal length, set by the operation of the zoom operating device 62, may be perceived by a value indicated on an LCD (liquid crystal display) panel (not shown) or the like.

When the focus operating device 63 is operated, the whole optical unit driving motor controller 60 drives the whole optical unit driving motor 25. At the same time the rear lens group driving motor controller 61 drives a rear lens group driving motor 30. Due to the driving of the whole optical unit driving motor controller 60 and the rear lens group driving motor controller 61, the front and rear lens groups L1 and L2 are moved to respective positions corresponding to a set focal length and a detected object distance and thereby the zoom lens is focused on the subject.

Specifically, the focus operating device 63 is provided with a release button (not shown) provided on an upper wall of the camera body. A photometering switch and a release switch (both not shown) are synchronized with the release button. When the release button is half-depressed (half step), the focus operating device 63 causes the photometering switch to be turned ON, and the object distance measuring and photometering commands are respectively input to the object distance measuring apparatus 64 and the photometering apparatus 65.

When the release button is fully depressed (full step), the focus operating device 63 causes the release switch to be turned ON, and according to the result of object distance measuring demand and a set focal length, the whole optical unit driving motor 25 and the rear lens group driving motor 30 are driven, and the focusing operation, in which the front lens group L1 and the rear lens group L2 move to the focusing position, is executed. Further, an AE motor 29 of an AF/AE (i.e., autofocus/autoexposure) shutter unit (electrical unit) 21 (FIG. 11) is driven via the AE motor controller 66 to actuate a shutter 27. During the shutter action, the AE motor controller 66 drives the AE motor 29 to open shutter blades 27a of the shutter 27 for a specified period of time according to the photometering information output from the photometering apparatus 65.

When the zoom operating device 62 is operated, the zoom operating device 62 drives the whole optical unit driving motor 25 to move the front and rear lens groups L1 and L2 together as a whole in the direction of the optical axis O (optical axis direction). Simultaneous with such a movement, the rear lens group driving motor 30 may also be driven via the rear lens group driving motor controller 61 to move the rear lens group L2 relative to the front lens group L1. However, this is not performed under the conventional concept of zooming in which the focal length is varied sequentially without moving the position of the focal point. When the zoom operating device 62 is operated, the following two modes are available, namely:

1. a mode to move the front lens group L1 and the rear lens group L2 in the optical axis direction without varying the distance therebetween by driving only the whole optical unit driving motor 25; and,
2. a mode to move the front lens group L1 and the rear lens group L2 in the optical axis direction while varying the distance therebetween by driving both the whole optical unit driving motor 25 and the rear lens group driving motor 30.

In mode 1, during a zooming operation an in-focus condition cannot be obtained at all times with respect to a subject located at a specific distance. However, this is not a problem in a lens-shutter type camera, since the image of the subject is not observed through the photographing optical system, but through the finder optical system that is provided separate from the photographing optical system, and it is sufficient to only be focused when the shutter is released. In mode 2, during a zooming operation, the front lens group L1 and the rear lens group L2 are moved without regard to whether the focal point moves, and when the shutter is released, the focusing operation (focus adjusting operation) is carried out by moving both the whole optical unit driving motor 25 and the rear lens group driving motor 30.

When the focus operating device 63 is operated in at least one part of the focal length range set by the zoom operating device 62, the whole optical unit driving motor 25 and the rear lens group driving motor 30 are driven to bring the subject into focus. The amount of movement of each lens group L1 or L2 by the whole optical unit driving motor 25 and the rear lens group driving motor 30 is determined not only using subject distance information provided from the object distance measuring apparatus 64, but also by using focal length information set by the zoom operating device 62. In such a manner, when the focus operating device 63 is operated, by moving both the whole optical unit driving motor 25 and the rear lens group driving motor 30, the position of the lens groups L1, L2 can be flexibly controlled, as compared with lens movements controlled by cam.

The zoom lens camera of this embodiment can also be controlled in a different manner such that, during an operation of the zoom operating device 62, only the magnification of the zoom finder 67 and the focal length information are varied without driving either the whole optical unit driving motor 25 or the rear lens group driving motor 30. When the focus operating device 63 is operated, both the whole optical unit driving motor 25 and the rear lens group driving motor 30 are moved simultaneously according to the focal length information and the subject distance information obtained by the object distance measuring apparatus 64 to move the front lens group L1 and the rear lens group L2 to respective positions determined according to the focal length and the subject distance information.

An embodiment of the zoom lens barrel according to the above concept will now be described with reference to mainly FIGS. 11 and 12.

The overall structure of the zoom lens barrel 10 will firstly be described.

The zoom lens barrel 10 is provided with the first moving barrel 20, the second moving barrel 19, the third moving barrel 16, and a fixed lens barrel block 12. The third moving barrel 16 is engaged with a cylindrical portion 12p of the fixed lens barrel block 12, and moves in the optical axis direction upon being rotated. The third moving barrel 16 is provided on an inner periphery thereof with a linear guide barrel 17, which is restricted in rotation. The linear guide barrel 17 and the third moving barrel 16 move together as a whole in the optical axis direction, with the third moving barrel 16 rotating relative to the linear guide barrel 17. The first moving barrel 20 moves in the optical axis direction with rotation thereof being restricted. The second moving barrel 19 moves in the optical axis direction, while rotating relative to the linear guide barrel 17 and the first moving barrel 20. The whole optical unit driving motor 25 is secured to the fixed lens barrel block 12. A shutter mounting stage 40 is secured to the first moving barrel 20. The AE motor 29 and the rear lens group driving motor 30 are mounted on the shutter mounting stage 40. The front lens group L1 and the rear lens group L2 are respectively supported by a lens supporting barrel (lens frame) 34 and a lens supporting barrel 50.

Figure 11:
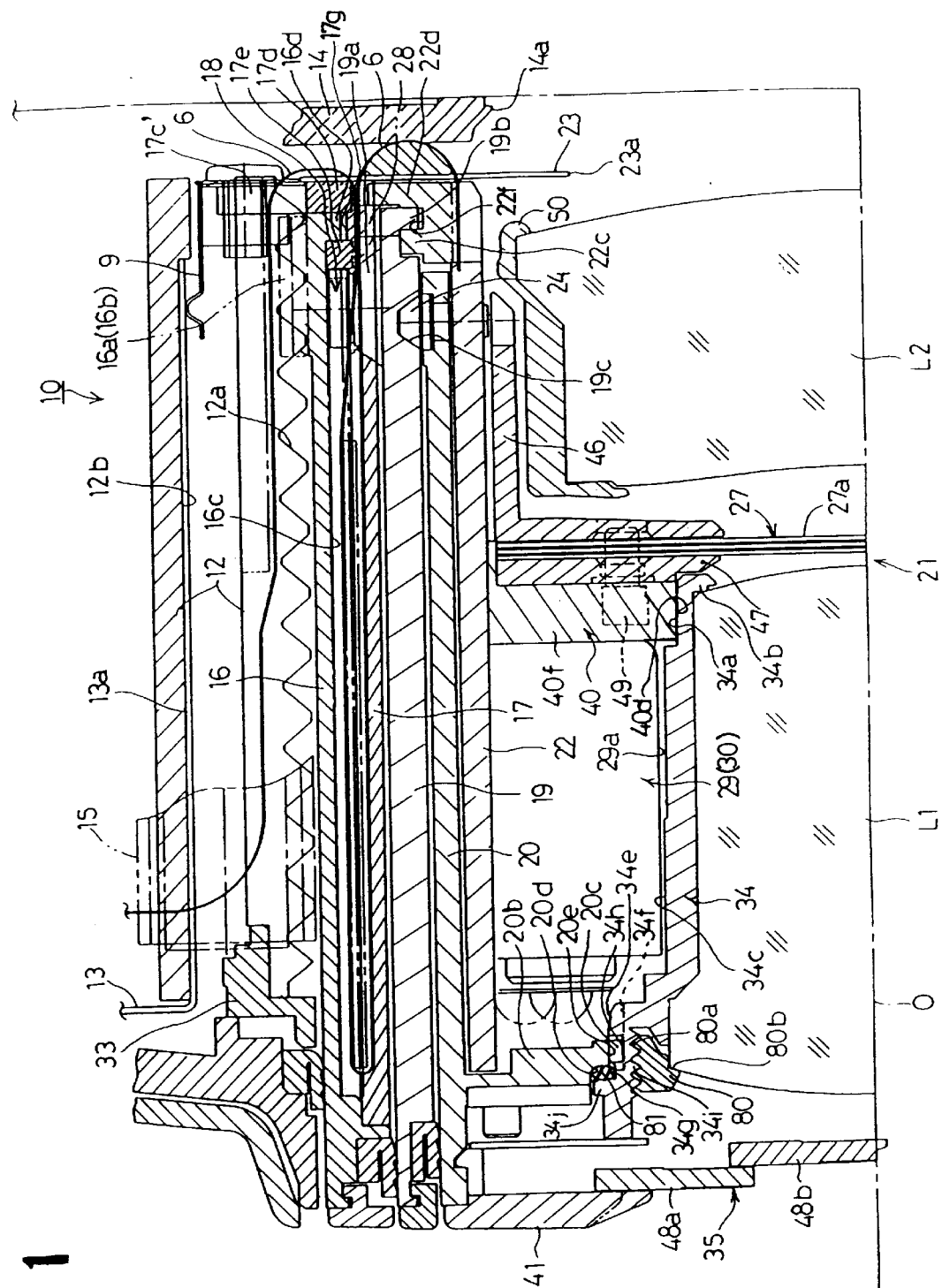
FIG. 11 is a sectional view of an upper part of the zoom lens barrel in the housed state.

An O-ring (annular elastic member) 81, made of a rubber or the like, is positioned between an outer peripheral circumferential surface of the lens supporting barrel 34, in the vicinity of the front end thereof, and an inner peripheral circumferential surface of an inner flange portion 20b formed integral with the first moving barrel 20 in the vicinity of the front end thereof, as shown in FIG. 11. The O-ring 81 prevents water from penetrating the zoom lens barrel 10 at the front end thereof between the first moving barrel 20 and the lens supporting barrel 34.

Figure 21:
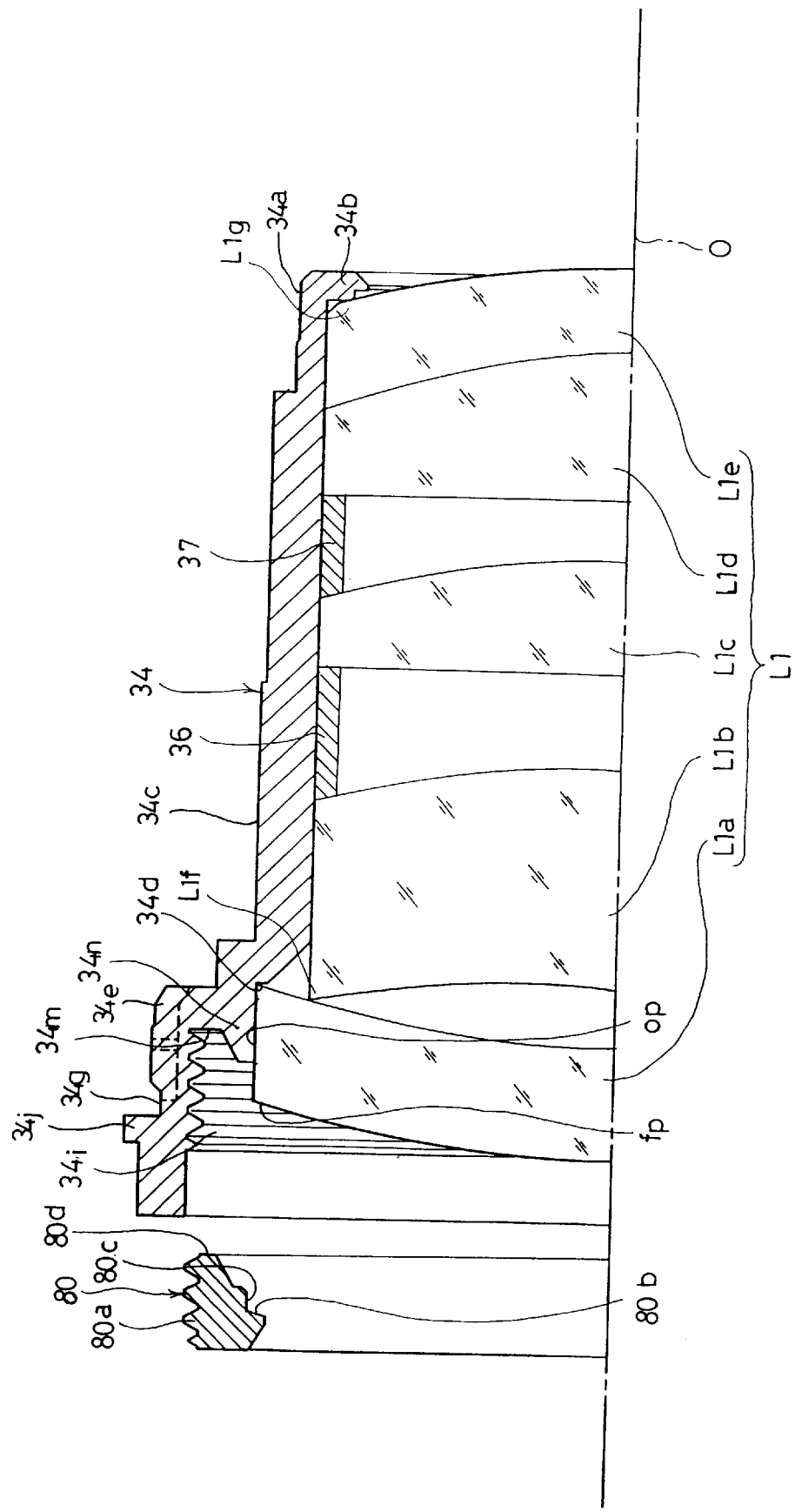
FIG. 21 is a sectional view of an upper part of the lens supporting barrel shown in FIG. 15, and a lens fixing ring which is to be screw-engaged with the lens supporting barrel.

As shown in FIG. 21, the front lens group L1 consists of five lenses, namely, a first lens (frontmost lens) L1 a, a second lens L1 b, a third lens L1 c, a fourth lens L1 d and a fifth lens L1 e in this order from an object side to an image side, i.e., from the left hand side to the right hand side as viewed in FIG. 21.

A front positioning ring 36 for determining a distance between the second lens L1 b and the third lens L1 c is positioned and held between the second lens L1 b and the third lens L1 c. An outer peripheral surface of the positioning ring 36 is fitted on an inner peripheral surface of the lens supporting barrel 34. Likewise, a rear positioning ring 37 for determining a distance between the third lens L1 c and the fourth lens L1 d is positioned and held between the third lens L1 c and the fourth lens L1 d. An outer peripheral surface of the positioning ring 37 is fitted on an inner peripheral surface of the lens supporting barrel 34. The rear surface of the fourth lens L1 d and the front surface of the fifth lens L1 e are cemented to each other, so that the fourth and fifth lenses L1 d, L1 e are formed as a cemented or composite lens. A front circumferential edge L1 f of the second lens L1 b along the circumferential edge thereof contacts the rear surface of the first lens L1 a. A rear circumferential edge L1 g of the fifth lens L1 e along the circumferential edge thereof contacts an inwardly-projecting flange 34b formed integral with the rear end of the lens supporting barrel 34.

Figure 15:
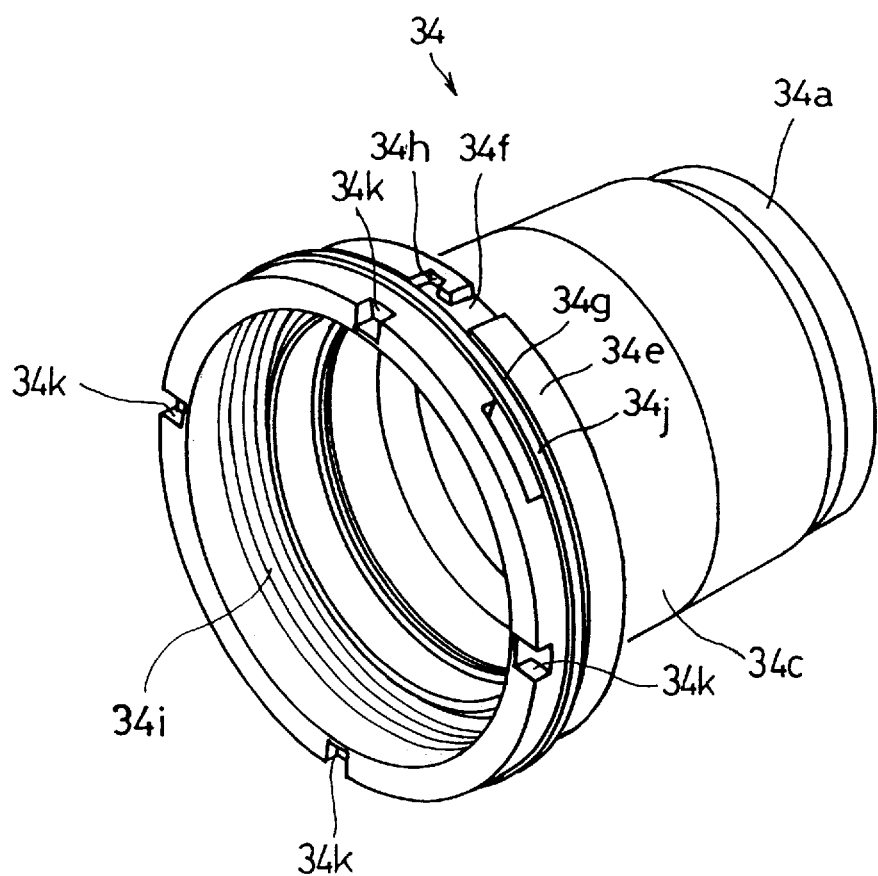
FIG. 15 is an enlarged perspective view of the lens supporting barrel shown in FIG. 14.
Figure 16:
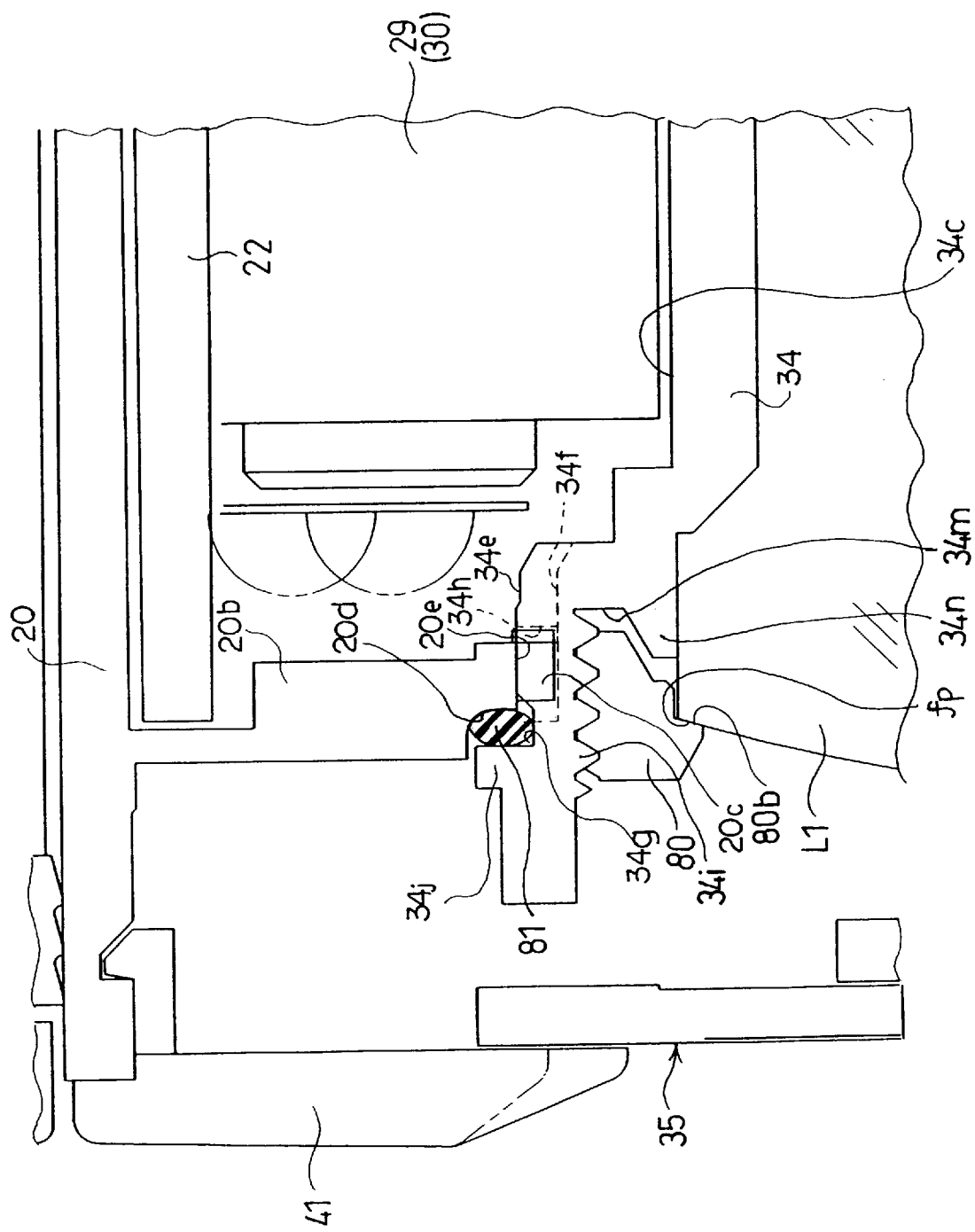
FIG. 16 is a schematic sectional view of a part of the zoom lens barrel, showing a supporting structure of the lens supporting barrel on the first moving barrel.

A female thread 34i is formed on an inner periphery of a front part of the lens supporting barrel 34, as shown in FIG. 15 or 21. A lens fixing ring 80, for fixing the first lens L1 a to the lens supporting barrel 34, engages with the lens supporting barrel 34. With this arrangement, a male thread 72a formed on the outer peripheral surface of the lens fixing ring 80 meshes with the female thread 34i. A circular abutting surface 80b is formed on the lens fixing ring 80 on an inner peripheral surface thereof. The circular abutting surface 80b comes into contact with a circumferential portion fp of the front surface of the first lens L1 a in a state when the lens fixing ring 80 is properly screw-engaged with the lens supporting barrel 34. The circular abutting surface 80b is formed to be substantially parallel to the circumferential portion fp so that the circular abutting surface 80b and the circumferential portion fp may be brought tightly into contact with each other when the lens fixing ring 80 is properly screw-engaged with the lens supporting barrel 34.

A supporting ring portion 34n is formed integral with the lens supporting barrel 34. The supporting ring portion 34n is located inwardly from the female thread 34i in a radial direction of the lens supporting barrel 34. The inner peripheral surface of the supporting ring portion 34n, which extends in the optical axis direction, comes into contact with an outer circumferential edge or surface op of the first lens L1 a. An annular positioning surface 34d, extending substantially normal to the optical axis O, is formed on the lens supporting barrel 34 immediately behind the supporting ring portion 34n. The circumferential edge of the rear surface of the first lens L1 a comes into contact with the positioning surface 34d. With this structure, the first lens L1 a is immovably held between the circular abutting surface 80b and the positioning surface 34d in the optical axis direction, and the first lens L1 a is immovably held by the supporting ring portion 34n in a radial direction normal to the optical axis O.

Figure 22:
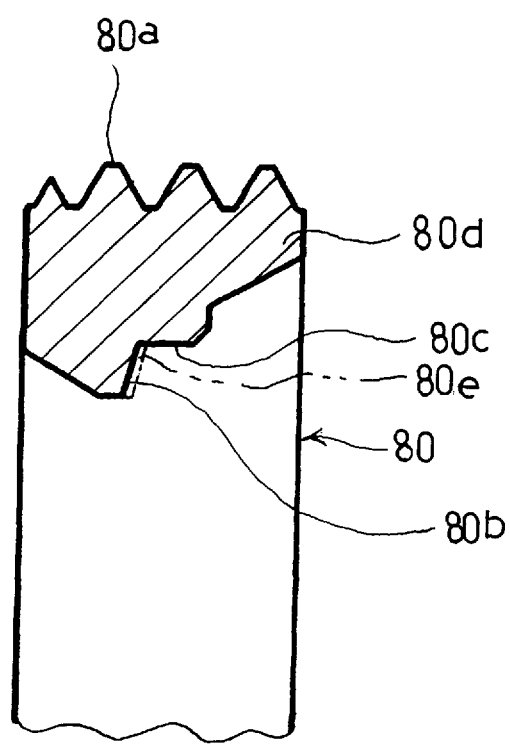
FIG. 22 is an enlarged sectional view of a part of the lens fixing ring shown in FIG. 21.

As shown in FIG. 22, a coating 80e is coated on the circular abutting surface 80b. The coating 80e is a waterproof coating made of a synthetic resin. In the present embodiment, "Fantas Coat SF-6 (trademark of a coating produced by the Japanese Company "Origin Denki Kabushiki Kaisha")" is used as the coating 80e. The front surface of the first lens L1 a is formed very smooth, whereas the circular abutting surface 80b of the lens fixing ring 80 is not formed as smoothly (i.e., has a rough finish) as the front surface of the first lens L1 a. This is because the first lens L1 a is more minutely and accurately formed than the lens fixing ring 80 since the first lens L1 a is a precision optical element. Due to this fact, were it not for the coating 80e on the circular abutting surface 80b, a substantial gap would be formed between the circular abutting surface 80b and the circumferential portion fp even if the circular abutting surface 80b properly and tightly in contact with the circumferential portion fp by properly screw-engaging the lens fixing ring 80 with the female thread 34i. As a result, water or moisture would be able to penetrate into the lens supporting barrel 34 through the substantial gap. However, in the present embodiment, the coating 80e is applied to the circular abutting surface 80b so as to make the surface thereof a smooth surface which does not cause to form such a substantial gap between the circular abutting surface 80b and the circumferential portion fp when the circular abutting surface 80b properly contacts the circumferential portion fp. Accordingly, the coating 80e, positioned and held between the circular abutting surface 80b and the circumferential portion fp, effectively prevents water or moisture from penetrating the lens supporting barrel 34 between the circular abutting surface 80b and the circumferential portion fp under the condition that the circular abutting surface 80b is properly and tightly in contact with the circumferential portion fp by properly screw-engaging the lens fixing ring 80 with the female thread 34i.

A circular surface 80c is formed on the lens fixing ring 80. The circular surface 80c is connected to the circular abutting surface 80b and is located immediately outward in a radial direction from the circular abutting surface 80b. A front part of the outer circumferential surface op of the first lens L1 a (i.e., a circumferential edge of the first lens L1 a) comes into contact with the circular surface 80c when the lens fixing ring 80 properly engages with the female thread 34i. Due to the circular surface 80c contacting the outer circumferential surface op, the watertight structure between the circular abutting surface 80b and the circumferential portion fp, that is realized by the coating 80e, is enhanced. That is, a highly efficient watertight connection between the first lens L1 a and the lens fixing ring 80 is realized by providing both the coating 80e and the circular surface 80c with the lens fixing ring 80.

An annular recessed portion 34m is formed on the lens supporting barrel 34 between the female thread 34i and the supporting ring portion 34n. As shown in FIG. 11, in a state where the lens fixing ring 80 is properly screw-engaged with the female thread 34i, a rear end 80d of the lens fixing ring 80 is positioned in the annular recessed portion 34m with the rear end 80d not contacting the bottom (i.e., rearmost end) of the recessed portion 34m, namely, an annular space is formed in the annular recessed portion 34m between the rear end 80d and the bottom of the recessed portion 34m.

The fixed lens barrel block 12 is fixed in front of an aperture plate 14 fixed to the camera body. The aperture plate 14 is provided on a center thereof with a rectangular-shaped aperture 14a which forms the limits of each frame exposed. The fixed lens barrel block 12 is provided, on an inner periphery of the cylindrical portion 12p, with a female helicoid 12a, and also a plurality of linear guide grooves 12b each extending parallel to the optical axis O, i.e., extending in the optical axis direction. At the bottom of one of the linear guide grooves 12b, namely 12b', a code plate 13a, having a predetermined code pattern, is fixed. The code plate 13a extends in the optical axis direction and extends along substantially the whole of the length of the fixed lens barrel block 12. The code plate 13a is part of a flexible printed circuit board 13 positioned outside the fixed lens barrel block 12.

Figure 7:
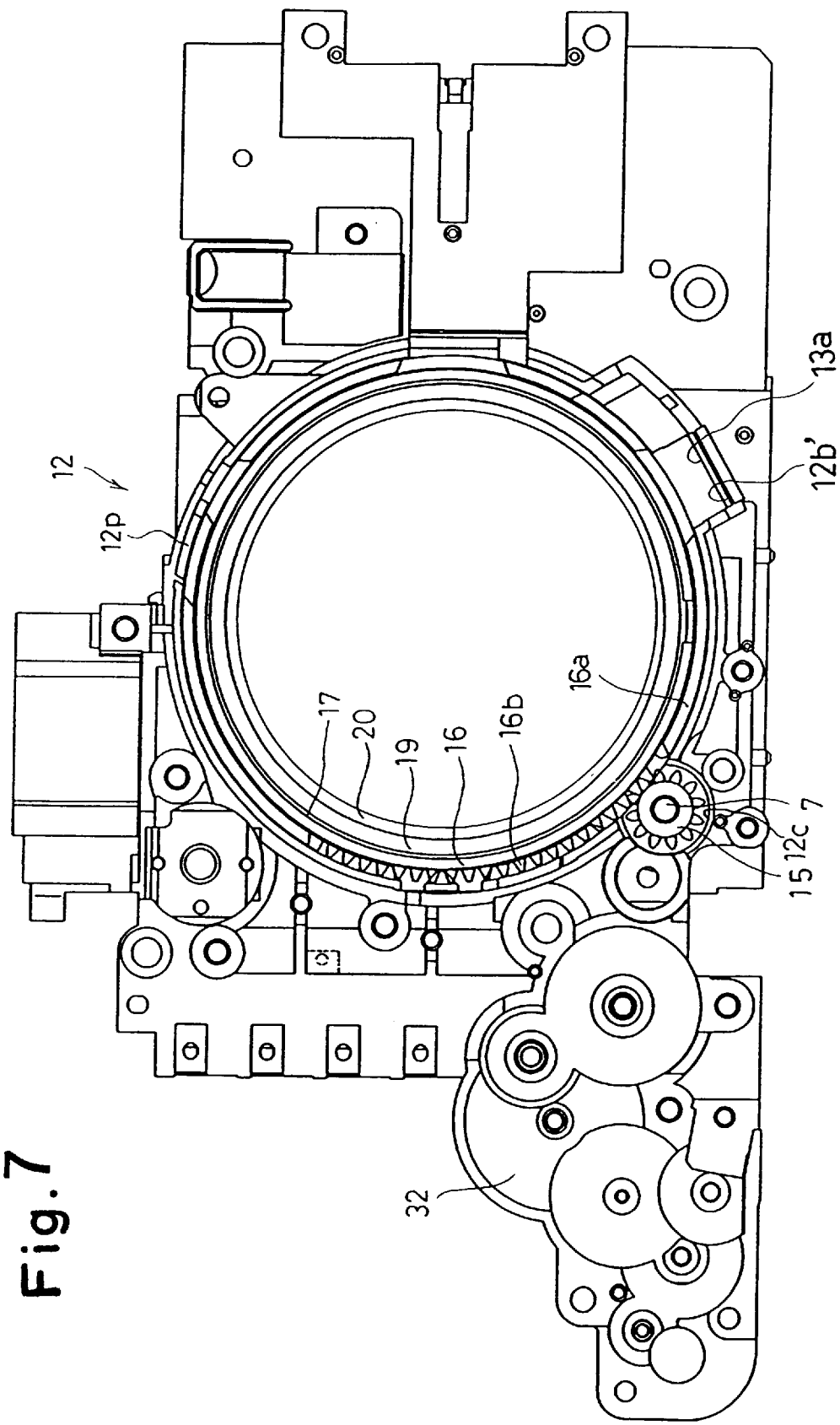
FIG. 7 is a front elevational view of a fixed lens barrel block of the zoom lens barrel.
Figure 12:
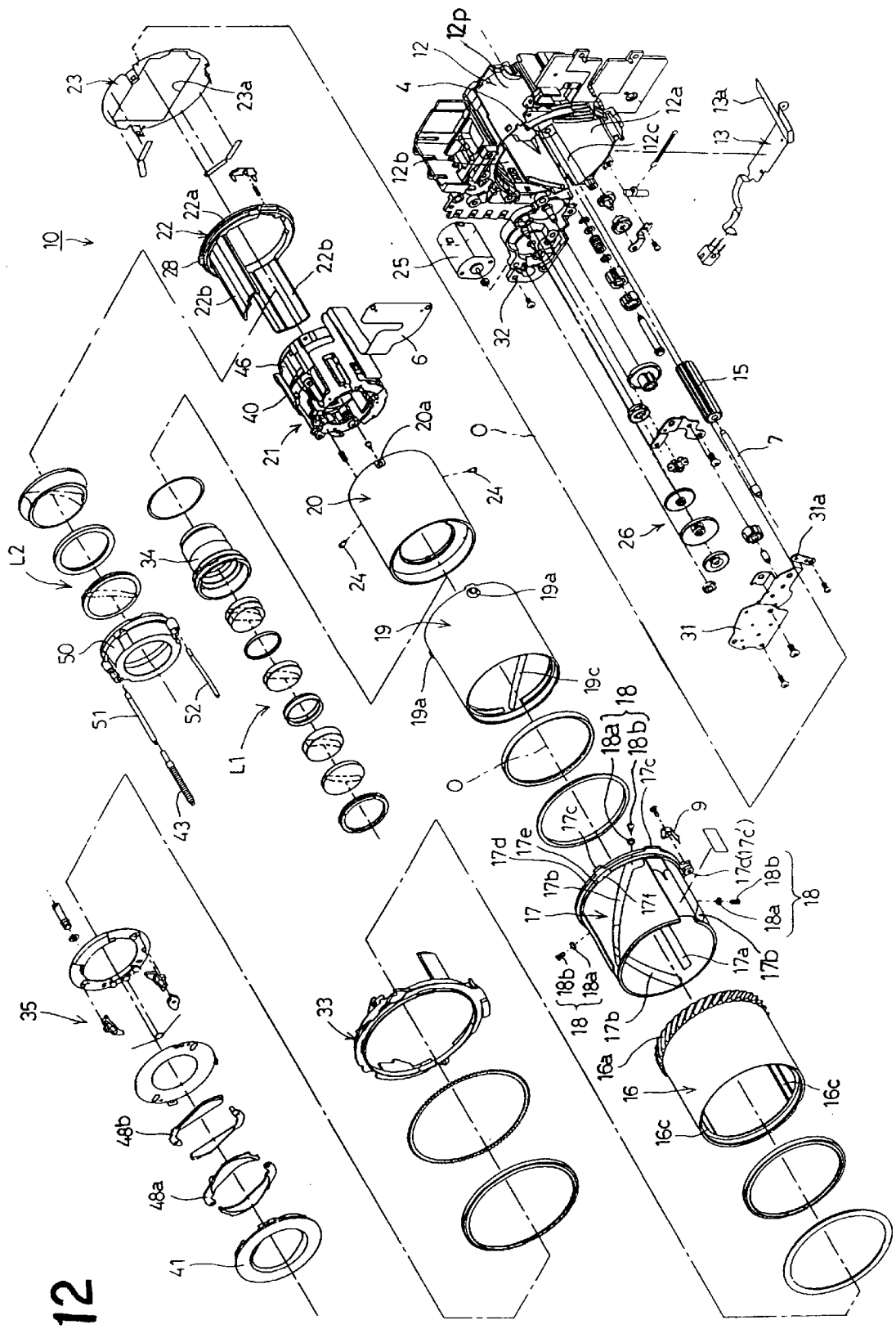
FIG. 12 is an exploded perspective view of the overall structure of the zoom lens barrel.

In the fixed lens barrel block 12, a gear housing 12c, which is recessed outwardly from an inner periphery of the cylindrical portion 12p of the fixed lens barrel block 12 in a radial direction while extending in the optical axis direction, is provided as shown in FIG. 7 or 12. In the gear housing 12c, a driving pinion 15, extending in the optical axis direction, is rotatably held. Both ends of an axial shaft 7 of the driving pinion 15 are rotatively supported by a supporting hollow 4, provided in the fixed lens barrel block 12, and a supporting hollow 31a, provided on a gear supporting plate 31 fixed on the fixed lens barrel block 12 by set screws (not shown), respectively. Part of the teeth of the driving pinion 15 project inwardly from the inner periphery of the cylindrical portion 12p of the fixed lens barrel block 12 so that the driving pinion 15 meshes with an outer peripheral gear 16b of the third moving barrel 16, as shown in FIG. 7.

Figure 6:
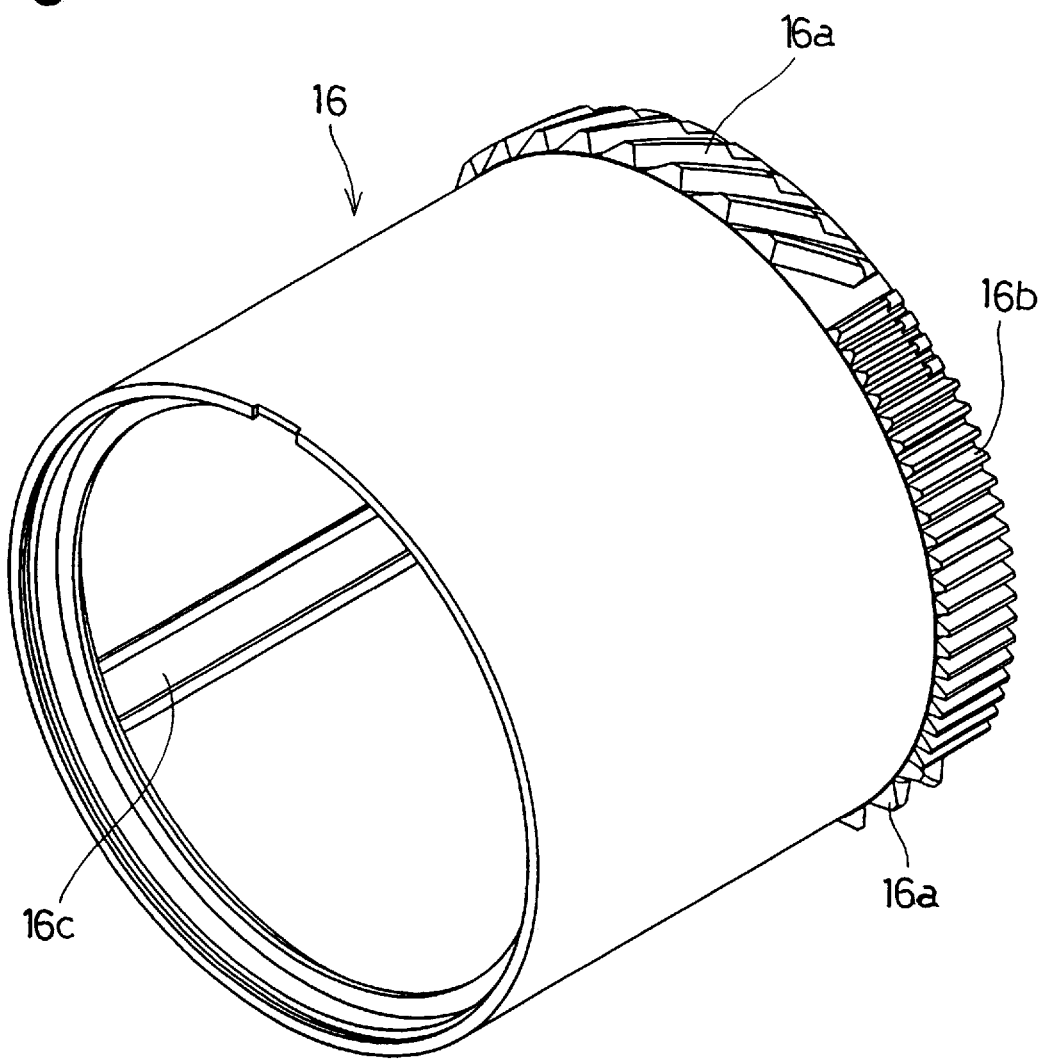
FIG. 6 is an enlarged schematic perspective view of a third moving barrel of the zoom lens barrel.

On an inner periphery of the third moving barrel 16, a plurality of linear guide grooves 16c, each extending parallel to the optical axis O, are formed. At an outer periphery of the rear end of the third moving barrel 16, a male helicoid 16a and the aforementioned outer peripheral gear 16b are provided as shown in FIG. 6. The male helicoid 16a engages with the female helicoid 12a of the fixed lens barrel block 12. The outer peripheral gear 16b engages with the driving pinion 15. The driving pinion 15 has an axial length sufficient to be capable of engaging with the outer peripheral gear 16b throughout the entire range of movement of the third moving barrel 16 in the optical axis direction.

Figure 20:
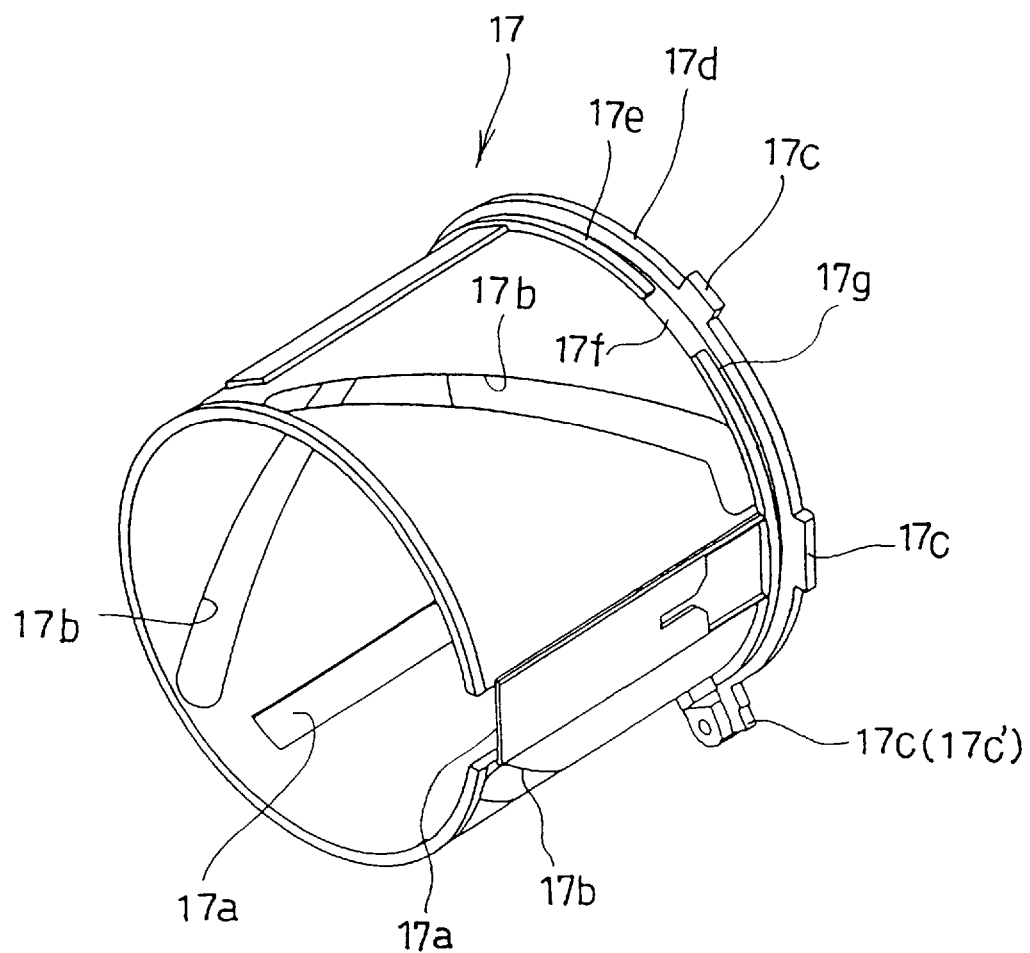
FIG. 20 is an enlarged perspective view of a linear guide barrel shown in FIG. 12.

As shown in FIG. 20, the linear guide barrel 17 is provided, on a rear part of an outer periphery thereof, with a rear end flange 17d. The rear end flange 17d has a plurality of engaging projections 17c each projecting away from the optical axis O in a radial direction. The linear guide barrel 17 is further provided, in front of the rear end flange 17d, with a retaining flange 17e. A circumferential groove 17g is formed between the rear end flange 17d and the retaining flange 17e. The retaining flange 17e has a radius smaller than the rear end flange 17d. The retaining flange 17e is provided with a plurality of cutout portions 17f. Each of the cutout portions 17f allows a corresponding engaging projection 16d to be inserted into the circumferential groove 17g, as shown in FIG. 11.

The third moving barrel 16 is provided, on an inner periphery of the rear end thereof, with a plurality of engaging projections 16d. Each of the engaging projections 16d projects towards the optical axis O in a radial direction. By inserting the engaging projections 16d into the circumferential groove 17g, through the corresponding cutout portions 17f, the engaging projections 16d are positioned in the circumferential groove 17g between the flanges 17d and 17e (see FIG. 11). By rotating the third moving barrel 16 relative to the linear guide barrel 17, the engaging projections 16d are engaged with the linear guide barrel 17.

On the rear end of the linear guide barrel 17, an aperture plate 23 having a rectangular-shaped aperture 23a approximately the same shape as the aperture 14a, is fixed.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis O.

A contacting terminal 9 is fixed to one of the engaging projections 17c, namely 17c'. The contacting terminal 9 is in slidable contact with the code plate 13a, fixed to the bottom of the linear guide groove 12b', to generate signals corresponding to focal length information during zooming.

On the inner periphery of the linear guide barrel 17 a plurality of linear guide grooves 17a are formed, each extending parallel to the optical axis O. A plurality of lead slots 17b are also formed on the linear guide barrel 17 as shown in FIG. 12 or 20. The lead slots 17b are each formed oblique (inclined) to the optical axis O.

The second moving barrel 19 engages with the inner periphery of the linear guide barrel 17. On the inner periphery of the second moving barrel 19, a plurality of lead grooves 19c are provided in a direction inclined oppositely to the lead slots 17b. On the outer periphery of the rear end of the second moving barrel 19 a plurality of follower projections 19a are provided. Each of the follower projections 19a has a trapezoidal cross-sectional shape projecting away from the optical axis O in a radial direction. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third moving barrel 16. With such an arrangement, when the third moving barrel 16 rotates, the second moving barrel 19 moves linearly in the optical axis direction, while rotating.

On the inner periphery of the second moving barrel 19, the first moving barrel 20 is engaged. The first moving barrel 20 is provided on an outer periphery of the rear thereof with a plurality of follower pins 24 each engaging with the corresponding inner lead groove 19c, and at the same time the first moving barrel 20 is guided linearly by a linear guide member 22. The first moving barrel 20 is provided at the front end thereof with a decorative plate 41 secured thereto.

Figure 1:
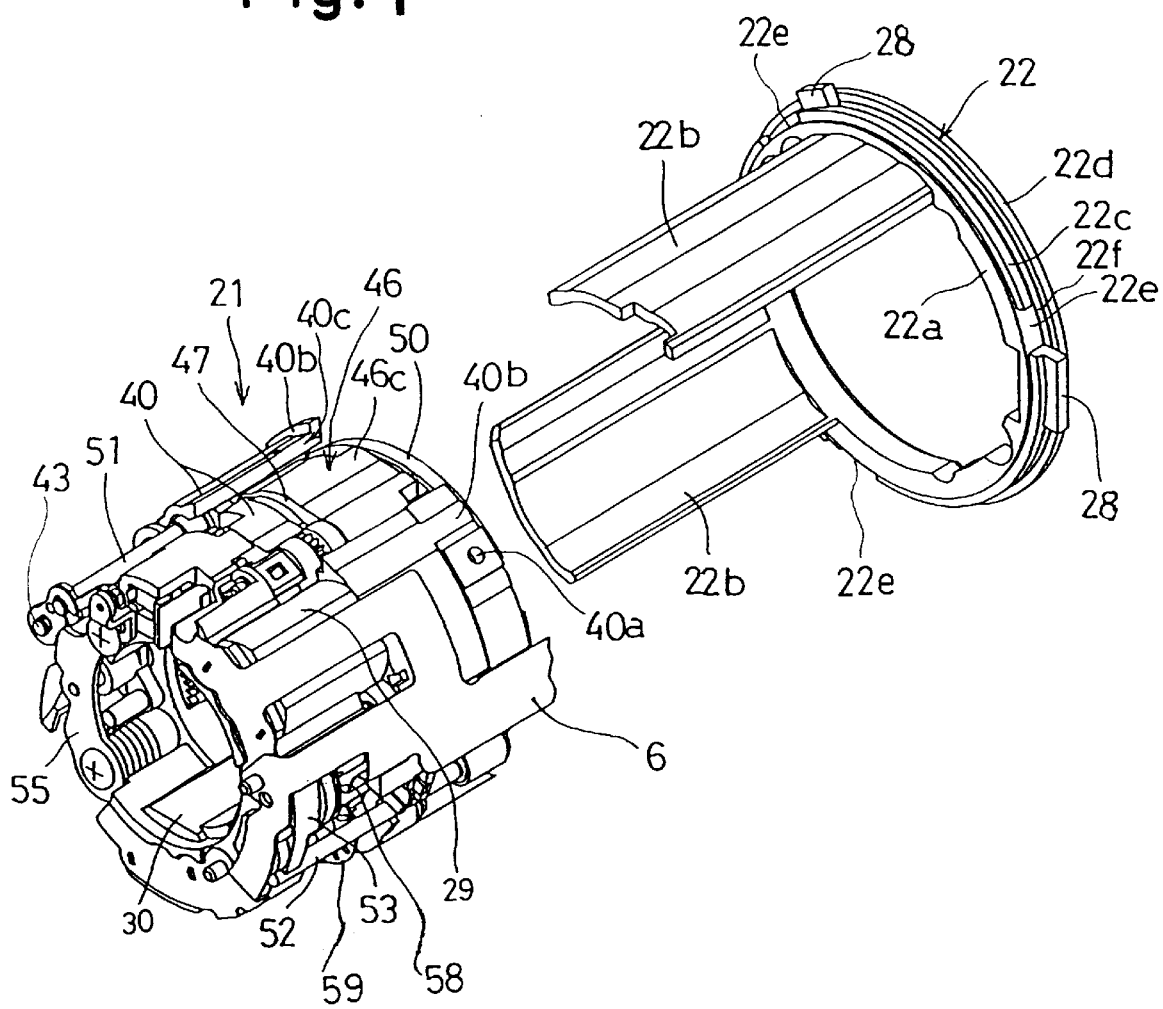
FIG. 1 is an enlarged schematic perspective view showing a part of a zoom lens barrel.
Figure 2:
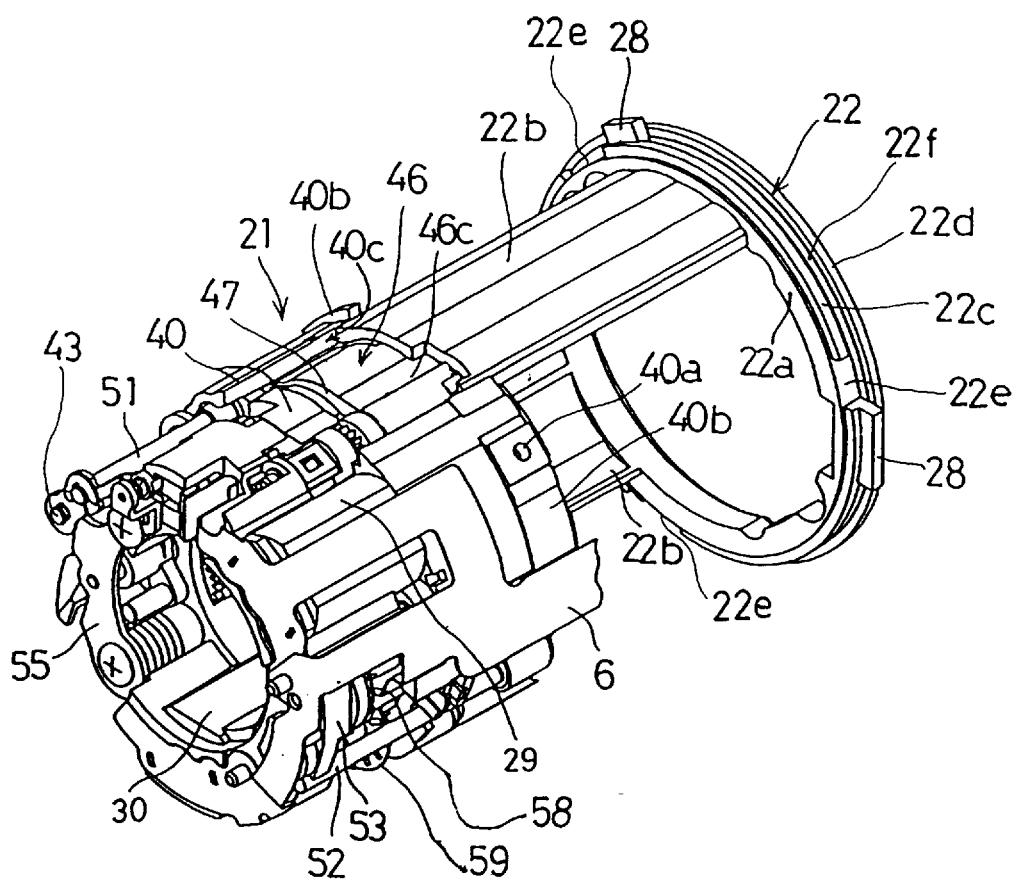
FIG. 2 is a schematic perspective view showing the part of the zoom lens barrel shown in FIG. 1 in an engaged state.
Figure 3:
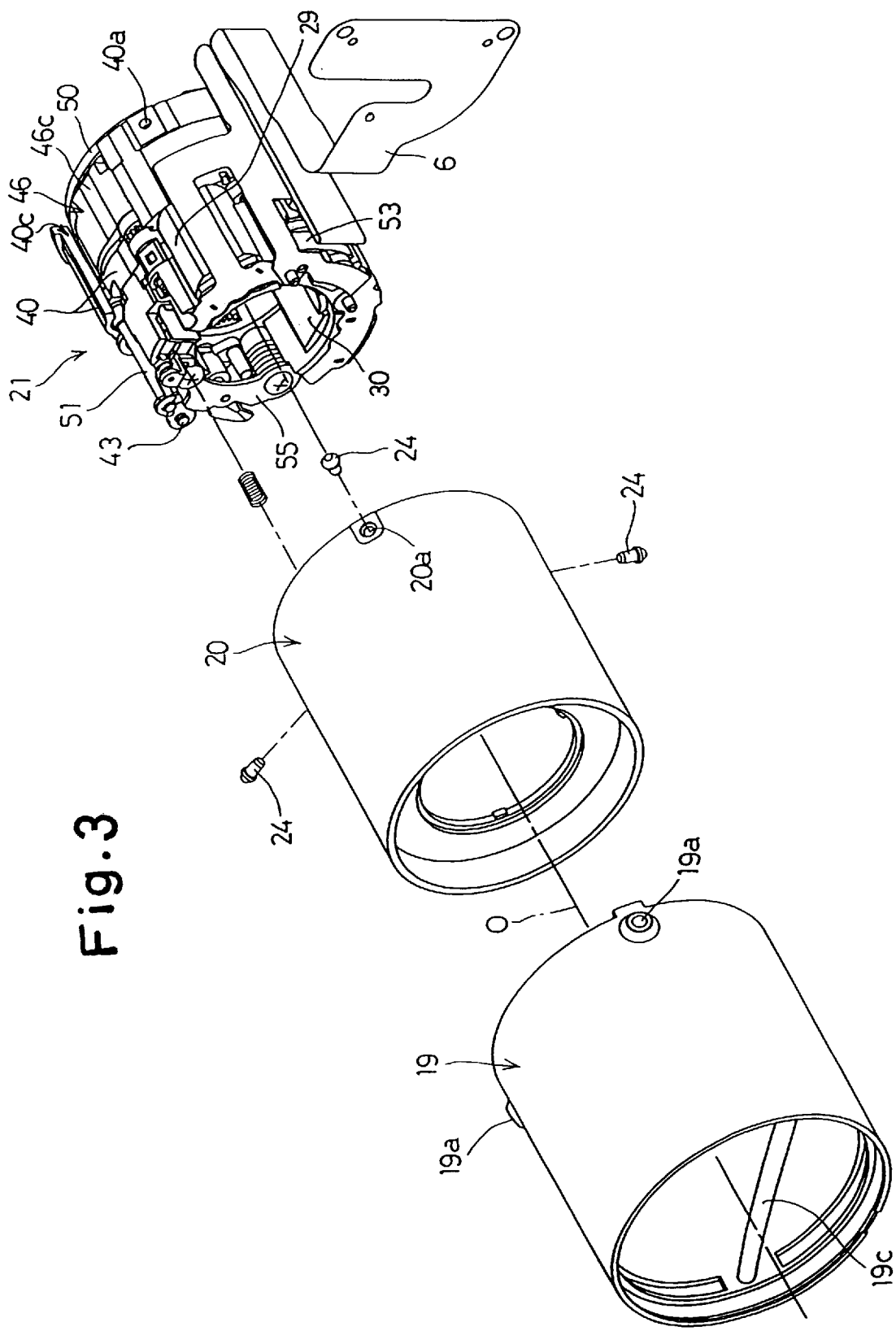
FIG. 3 is an enlarged exploded perspective view of a part of the zoom lens barrel.

As shown in FIGS. 1 and 2, the linear guide member 22 is provided with an annular member 22a, a pair of guide legs 22b and a plurality of engaging projections 28. The pair of guide legs 22b project from the annular member 22a in the optical axis direction. The plurality of engaging projections 28 each project from the annular member 22a away from the optical axis O in a radial direction. The engaging projections 28 slidably engage with the linear guide grooves 17a. The guide legs 22b are respectively inserted into linear guides 40c between the inner peripheral surface of the first moving barrel 20 and the AF/AE shutter unit 21.

The annular member 22a of the linear guide member 22 is connected to the rear of the second moving barrel 19, such that the linear guide member 22 and the second moving barrel 19 are capable of moving along the optical axis O as a whole, and in addition are capable of relatively rotating around the optical axis O. The linear guide member 22 is further provided on the outer periphery of the rear end thereof with a rear end flange 22d. The linear guide member 22 is further provided, in front of the rear end flange 22d, with a retaining flange 22c. A circumferential groove 22f is formed between the rear end flange 22d and the retaining flange 22c. The retaining flange 22c has a radius smaller than the rear end flange 22d. The retaining flange 22c is provided with a plurality of cutout portions 22e, as shown in FIG. 1 or 2, each allowing a corresponding engaging projection 19b to be inserted into the circumferential groove 22f, as shown in FIG. 11.

The second moving barrel 19 is provided on an inner periphery of the rear end thereof with a plurality of engaging projections 19b, each projecting towards the optical axis O in a radial direction. By inserting the engaging projections 19b into the circumferential groove 22f through the corresponding cutout portions 22e, the engaging projections 19b are positioned in the circumferential groove 22f between the flanges 22c and 22d. By rotating the second moving barrel 19 relative to the linear guide member 22, the engaging projections 19b are engaged with the linear guide member 22. With the above structure, when the second moving barrel 19 rotates in the forward or reverse rotational direction, the first moving barrel 20 moves linearly, forwardly or rearwardly along the optical axis O, but is restricted from rotating.

Figure 9:
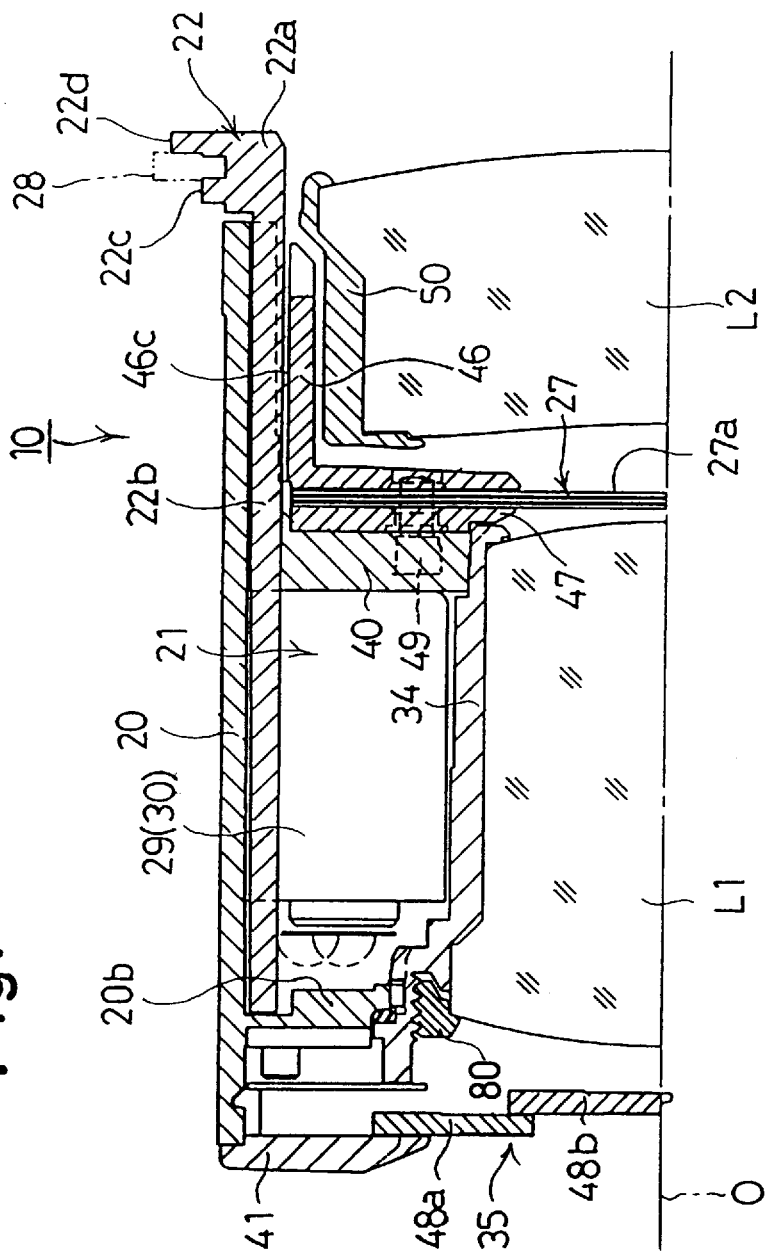
FIG. 9 is a sectional view of an upper part of the zoom lens barrel, illustrating essential elements in a housed state.

At the front of the first moving barrel 20, a barrier apparatus 35 having barrier blades 48a and 48b is mounted. On an inner peripheral face of the first moving barrel 20 the AF/AE shutter unit 21 having the shutter 27, consisting of three shutter blades 27a, is engaged and fixed, as shown in FIG. 9. The AF/AE shutter unit 21 is provided with a plurality of fixing holes 40a formed at even angular intervals on the outer periphery of the shutter mounting stage 40. Only one of the fixing holes 40a appears in each of FIGS. 1 through 5.

Figure 4:
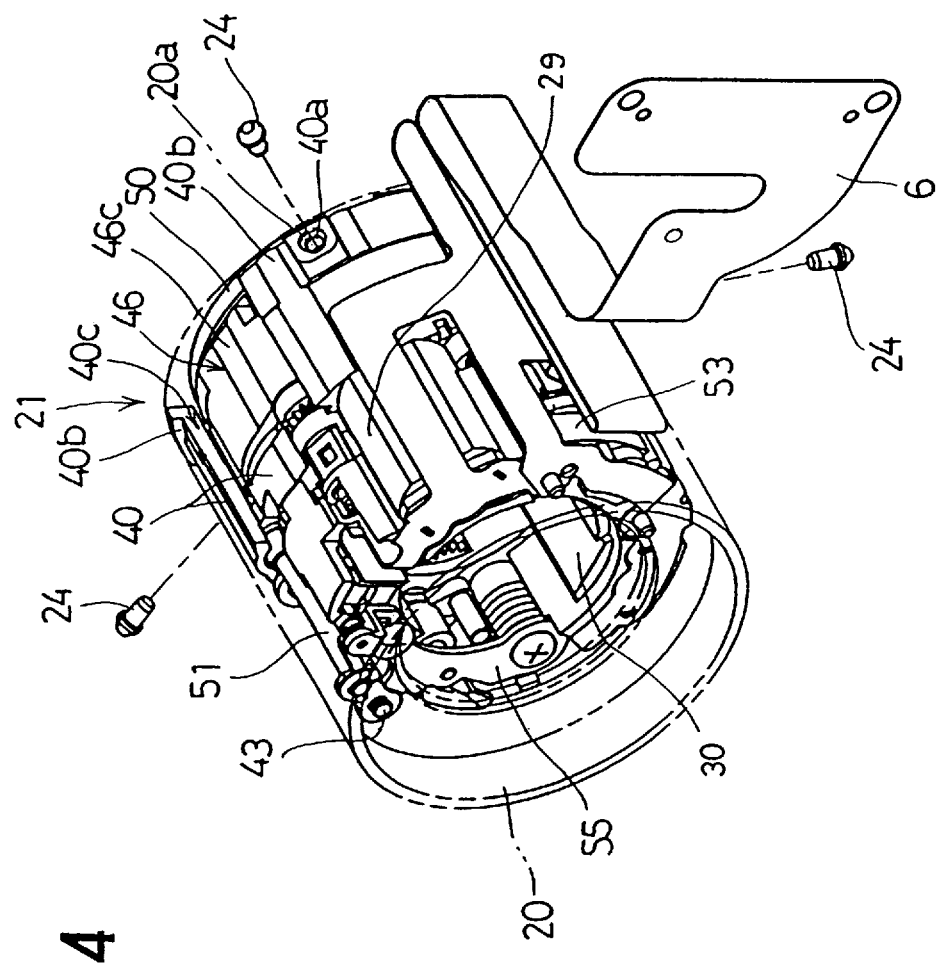
FIG. 4 is a schematic perspective view illustrating a state where an AF/AE shutter unit of the zoom lens barrel is mounted to a first moving barrel.

The aforementioned plurality of follower pins 24, which engage with the inner lead grooves 19c, also serve as a device for fixing the AF/AE shutter unit 21 to the first moving barrel 20. The follower pins 24 are inserted in holes 20a, formed on the first moving barrel 20, and fixed in the fixing holes 40a. With this arrangement the AF/AE shutter unit 21 is secured to the first moving barrel 20 as shown in FIG. 4. In FIG. 4 the first moving barrel 20 is indicated by phantom lines. The follower pins 24 may be fixed by an adhesive, or the pins 24 may be formed as screws to be screwed into the fixing holes 40a.

Figure 5:
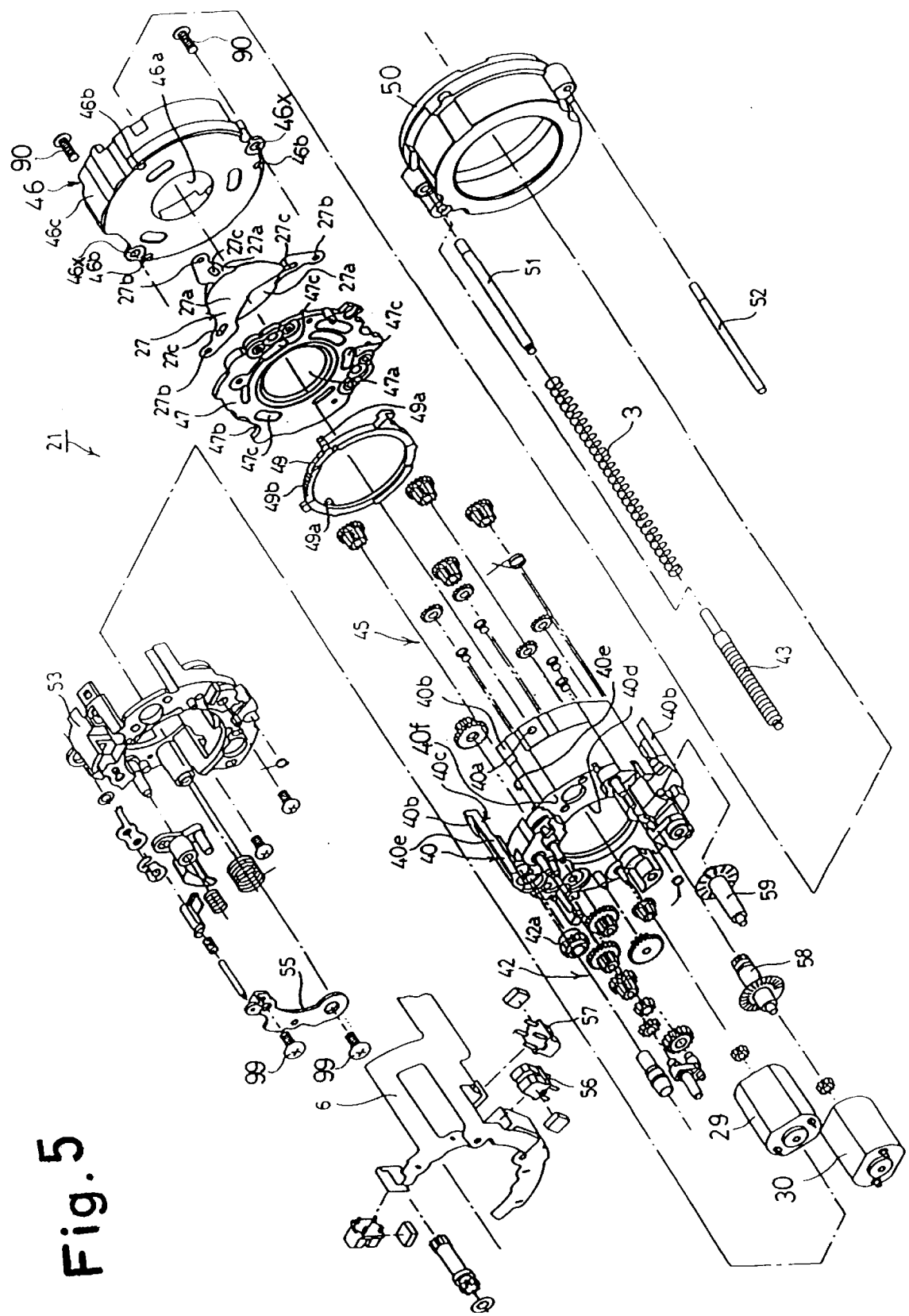
FIG. 5 is an exploded perspective view illustrating main parts of the AF/AE shutter unit of the zoom lens barrel shown in FIG. 1, 2, 3 or 4.

As illustrated in FIGS. 5 and 12, the AF/AE shutter unit 21 is provided with the shutter mounting stage 40, a shutter blade supporting ring 46 fixed on the rear of the shutter mounting stage 40 so as to be located inside the shutter mounting stage 40, and the lens supporting barrel 50 supported in a state of being capable of movement relative to the shutter mounting stage 40. On the shutter mounting stage 40, the lens supporting barrel 34, the AE motor 29, and the rear lens group driving motor 30, are supported.

The shutter mounting stage 40 is provided with an annular member 40f having a circular aperture 40d. The shutter mounting stage 40 is also provided with three legs 40b which project rearward from the annular member 40f. Three slits are defined between the three legs 40b. Two of the slits comprise the aforementioned linear guides 40c, which slidably engage with the respective pair of guide legs 22b of the linear guide member 22 so as to guide the movement of the linear guide member 22.

The shutter mounting stage 40 supports an AE gear train 45, which transmits a rotation of the AE motor 29 to the shutter 27, a lens driving gear train 42, which transmits rotation of the rear lens group driving motor 30 to a screw shaft 43, photointerrupters 56 and 57, connected to a flexible printed circuit board 6, and rotating disks 58 and 59, having a plurality of radially formed slits provided in the circumferential direction. An encoder for detecting whether the rear lens group driving motor 30 is rotating and for detecting an amount of rotation of the rear lens group driving motor 30 consists of the photointerrupter 57 and the rotating disk 59. An AE motor encoder for detecting whether the AE motor 29 is rotating and for detecting an amount of rotation of the AE motor 29 consists of the photointerrupter 56 and the rotating disk 58.

The shutter 27, a supporting member 47 which pivotally supports the three shutter blades 27a of the shutter 27, and a circular driving member 49, which gives rotative power to the shutter blades 27a, are positioned between the shutter mounting stage 40 and the shutter blade supporting ring 46, secured to the shutter mounting stage 40. The circular driving member 49 is provided with three operating projections 49a at even angular intervals, which respectively engage with each of the three shutter blades 27a. As shown in FIG. 5, the shutter blade supporting ring 46 is provided, at a front end thereof, with a circular aperture 46a and with three supporting holes 46b positioned at even angular intervals around the circular aperture 46a. Two deflection restricting surfaces 46c are formed on the outer periphery of the shutter blade supporting ring 46. Each deflection restricting surface 46c is exposed outwardly from the corresponding linear guide 40c and slidably supports the inner peripheral face of the corresponding guide leg 22b.

The supporting member 47, positioned in front of the shutter blade supporting ring 46, is provided with a circular aperture 47a, aligned with the circular aperture 46a of the shutter blade supporting ring 46, and with three pivotal shafts 47b (only one of which is illustrated in FIG. 5) at respective positions opposite the three supporting holes 46b. Each shutter blade 27a is provided at one end thereof with a hole 27b into which the corresponding pivotal shaft 47b is inserted, so that each shutter blade 27a is rotatable about the corresponding pivotal shaft 47b. The major part of each shutter blade 27a, that extends normal to the optical axis O from the pivoted end, is formed as a light interceptive portion. All three light interceptive portions of the shutter blades 27a together prevent ambient light, which enters the front lens group L1, from entering the circular apertures 46a and 47a when the shutter blades 27a are closed. Each shutter blade 27a is further provided, between the hole 27b and the light interceptive portion thereof, with a slot 27c, through which the corresponding operating projection 49a is inserted. The supporting member 47 is fixed to the shutter blade supporting ring 46 in such a manner that each shaft 47b, which supports the corresponding shutter blade 27a, is engaged with the corresponding supporting hole 46b of the shutter blade supporting ring 46.

A gear portion 49b is formed on a part of the outer periphery of the circular driving member 49. The gear portion 49b meshes with one of the plurality of gears in the gear train 45 to receive the rotation from the gear train 45. The supporting member 47 is provided, at respective positions close to the three pivotal shafts 47b, with three arc grooves 47c each arched along a circumferential direction. The three operating projections 49a of the circular driving ring 49 engage with the slots 27c of the respective shutter blades 27a through the respective arc grooves 47c. The shutter blade supporting ring 46 is inserted from the rear of the shutter mounting stage 40, to support the circular driving ring 49, the supporting member 47 and the shutter 27, and is fixed on the shutter mounting stage 40 by set screws 90 respectively inserted through holes 46x provided on the shutter blade supporting ring 46.

Behind the shutter blade supporting ring 46, the lens supporting barrel 50, supported to be able to move relative to the shutter mounting stage 40 via guide shafts 51 and 52, is positioned. The shutter mounting stage 40 and the lens supporting barrel 50 are biased in opposite directions away from each other by a coil spring 3 fitted on the guide shaft 51, and therefore play between the shutter mounting stage 40 and the lens supporting barrel 50 is reduced. In addition, a driving gear 42a, provided as one of the gears in the gear train 42, is provided with a female thread hole (not shown) at the axial center thereof and is restricted to move in the axial direction. The screw shaft 43, one end of which is fixed to the lens supporting barrel 50, engages with the female thread hole. Accordingly, the driving gear 42a and the screw shaft 43 together constitute a feed screw mechanism. In such a manner, when the driving gear 42a rotates forwardly or reversely due to driving by the rear lens group driving motor 30, the screw shaft 43 respectively moves forwardly or rearwardly with respect to the driving gear 42a, and therefore the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws 99. The motors 29, 30 and the photointerrupters 56, 57 are connected to the flexible printed circuit board 6. One end of the flexible printed circuit board 6 is fixed to the shutter mounting stage 40.

After the first, second and third moving barrels 20, 19 and 16, and the AF/AE shutter unit 21 and the like are assembled, the aperture plate 23 is fixed to the rear of the linear guide barrel 17, and an annular retaining member 33 is fixed at the front of the fixed lens barrel block 12.

The details of the structure for supporting the lens supporting barrel 34 on the first moving barrel 20 will be discussed hereinafter with reference to FIGS. 11 to 22.

The lens supporting barrel 34, which supports the front lens group L1 therein, is fixed to the first moving barrel 20 through a connecting mechanism similar to a bayonet mechanism. The front and rear ends of the lens supporting barrel 34 are supported by the first moving barrel 20 and the shutter mounting stage 40 of the AF/AE shutter unit 21, respectively. Bayonet mechanisms are widely adopted for detachably connecting an interchangeable lens to a lens mount of an SLR camera.

The center of a circular aperture 20e of the inner flange portion 20b coincides with the optical axis O. The front end of the lens supporting frame 34 is engaged with the inner flange portion 20b so that the front end of the lens supporting frame 34 is restricted from moving in a radial direction perpendicular to the optical axis O.

Figure 18:
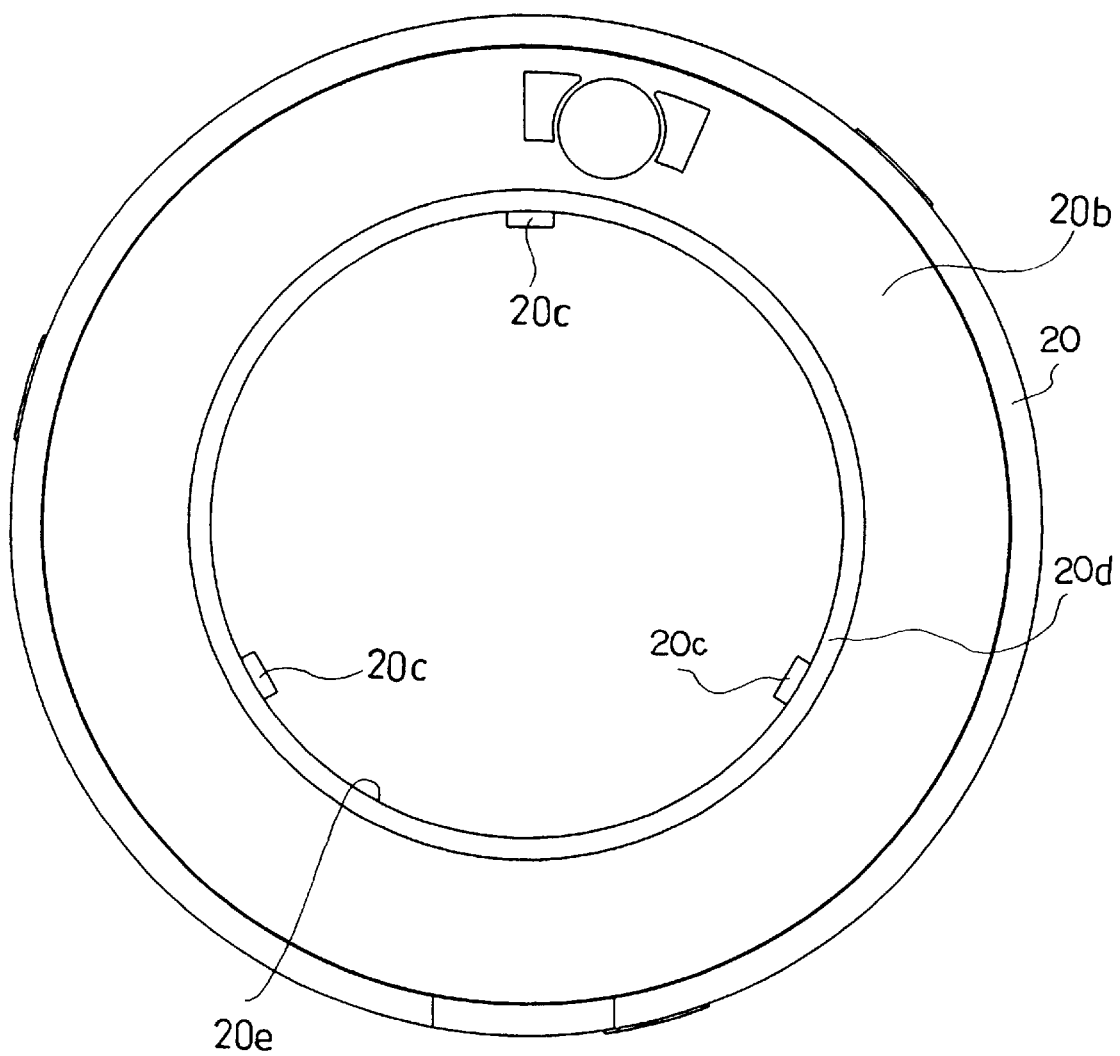
FIG. 18 is a front elevational view of the first moving barrel.
Figure 19:
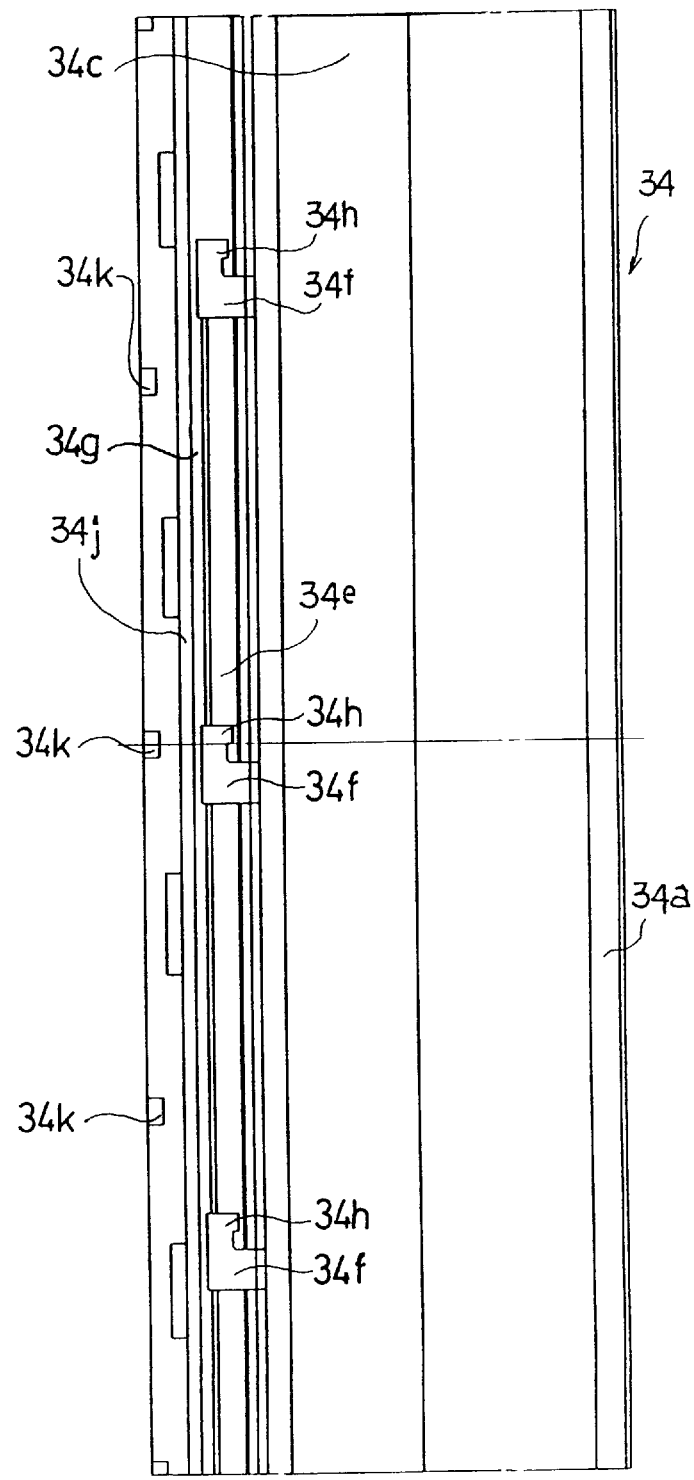
FIG. 19 is a developed view of the outer periphery of the lens supporting barrel shown in FIG. 15.

Three engaging projections 20c are integrally formed on an inner circumferential edge of the inner flange portion 20b at even angular intervals, as shown in FIG. 18.

Figure 17:
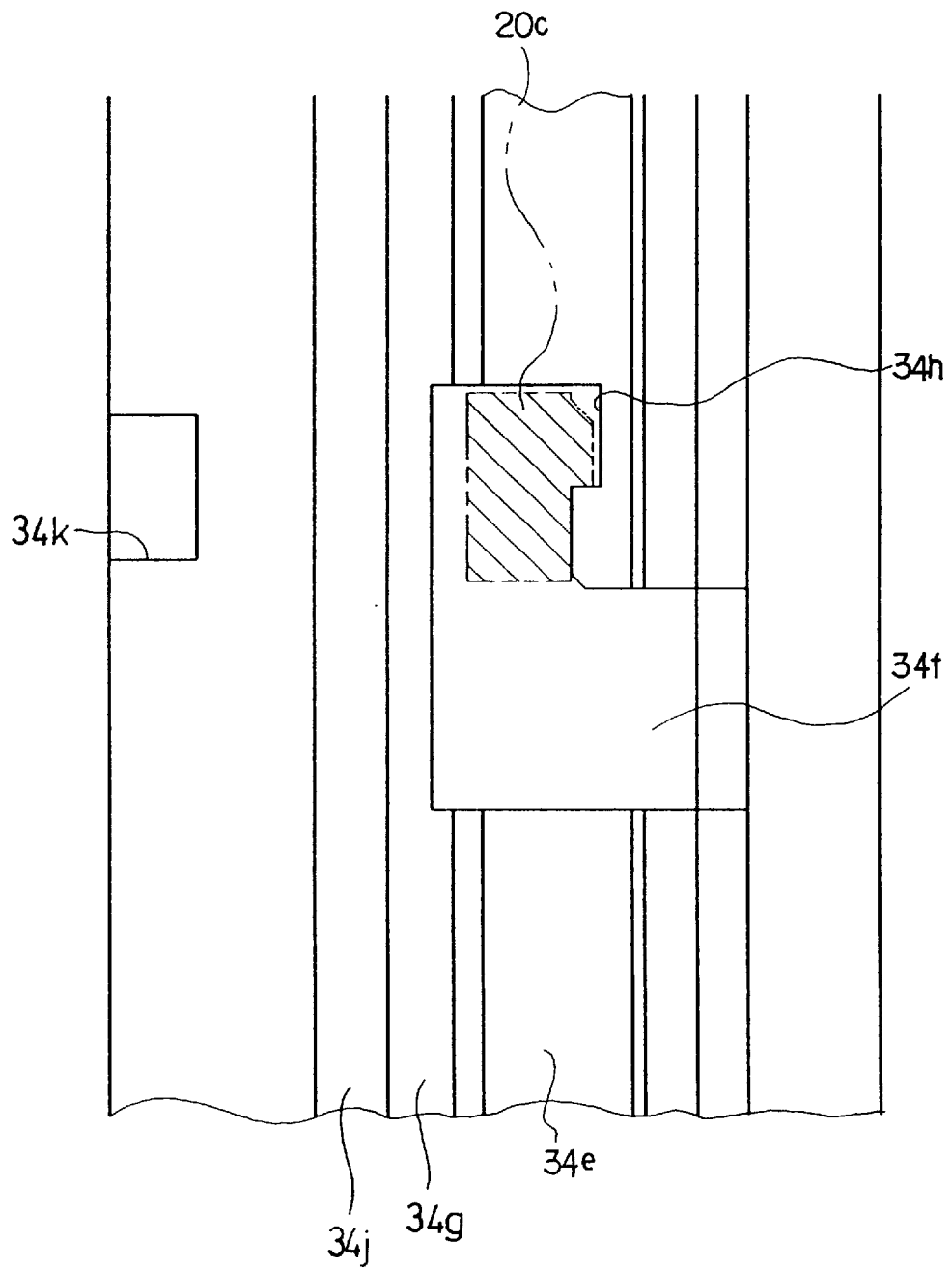
FIG. 17 is a plan view of a part of the lens supporting barrel shown in FIG. 15.

To secure the lens supporting frame 34 inside the first lens barrel 20, firstly, each engaging projection 20c is inserted into a corresponding one of three engaging recesses 34f formed on the lens supporting barrel 34. Thereafter the lens supporting barrel 34 is rotated along the optical axis O by a predetermined amount relative to the first moving barrel 20 to thereby bring the engaging projections 20c into engagement with locking recesses 34h formed on the lens supporting barrel 34 each adjacent to a corresponding engaging recess 34f. Each of the locking recesses 34h is formed to have a width greater than the corresponding engaging projection 20c by a predetermined amount in the optical axis direction (horizontal direction as viewed in FIG. 17), as shown in FIG. 17.

The O-ring 81 is positioned between an annular recess 20d and an outer flange 34j. The O-ring 81 may be made of other materials having like properties as rubber. The annular recess 20d is formed along the inner circumferential edge of the inner flange portion 20b at a front portion thereof. The outer flange 34j is integrally formed on an outer periphery of the lens supporting barrel 34 in the vicinity of the front end thereof.

The lens supporting barrel 34 is provided at a rear end thereof with a rear engaging portion 34a which is fitted in the circular aperture 40d to be supported by the annular member 40f of the shutter mounting stage 40. With this arrangement, the rear end of the lens supporting barrel 34 is restricted from moving in a radial direction perpendicular to the optical axis O. Consequently, the front and rear ends of the lens supporting barrel 34 are supported by the inner flange portion 20b and the annular member 40f, respectively, which determines the radial position of the front lens group L1 relative to the first moving barrel 20, that is, relative to the rear lens group L2.

The lens supporting barrel 34 is provided at a front end thereof with a front engaging portion 34e. The front engaging portion 34e is fitted in the circular aperture 20e to be supported by the inner flange portion 20b. The lens supporting barrel 34 is provided with an intermediate portion 34c between the front and rear engaging portions 34e, 34a. The outer diameter of the intermediate portion 34c is smaller than that of the front engaging portion 34e so as to be positioned in a substantially cylindrical space is of the AF/AE shutter unit 21.

The lens supporting barrel 34 is provided at a rearmost end thereof with the inwardly-projecting flange 34b, extending toward the optical axis O, as noted above. The inwardly-projecting flange 34b contacts the circumferential edge of the rear end of the rear lens group L2 to prevent the rear lens group L2 from moving rearward therefrom.

A circumferential groove 34g is formed on the lens supporting barrel 34 immediately behind the outer flange 34j. The O-ring 81 is positioned on the circumferential groove 34g.

The aforementioned three engaging recesses 34f and the three locking recesses 34h are formed on the front engaging portion 34e. Each of the engaging recesses 34f and a corresponding one of the locking recesses 34h, which are adjacent to each other, are connected in a circumferential direction along the front engaging portion 34e, as can be seen from FIG. 15, 17 or 19. In a state where the lens supporting barrel 34 is properly positioned in the first lens barrel 20 with the O-ring 81 being positioned between the outer flange 34j and the annular recess 20d, the O-ring 81 is compressed therebetween, so that the outer flange 34j is biased forwardly, away from the inner flange portion 20b, thereby the engaging projections 20c firmly engage with the locking recesses 34h. This ensures the engagement of the engaging projections 20c with the locking recesses 34h, while also ensuring a watertight connection between the first moving barrel 20 and the lens supporting barrel 34 at a front thereof.

A plurality of radial recesses 34k are formed at the frontmost end of the lens supporting barrel 34 at even angular intervals.

During an assembly of the zoom lens barrel 10, before the lens supporting barrel 34 is positioned in the first moving barrel 20, the front lens group L1 is inserted in the lens supporting barrel 34 and is subsequently secured to the lens supporting barrel 34 by screw-engaging the lens fixing ring 80 with the female thread 34i in advance. After the AF/AE shutter unit 21 is fixed inside the first moving barrel 20 through the follower pins 24, the lens supporting barrel 34 with the front lens group L1 being positioned therein, is inserted from the rear end thereof, into the first moving barrel 20 through the circular aperture 20e. Subsequently, the rear engaging portion 34a is inserted in the circular aperture 40d with each engaging projection 20c being inserted in the corresponding engaging recess 34f to thereby engage the front engaging portion 34e with the circular aperture 20e.

In such a state the lens supporting barrel 34 is thereafter rotated by a predetermined amount about the optical axis O relative to the first moving barrel 20 in the clockwise direction as viewed in FIG. 15, with the lens supporting barrel 34 being pressed rearward against the biasing force of the O-ring 81 toward the rear lens group L2 by using a predetermined tool (not shown). The predetermined tool is provided with a plurality of pins which are respectively engageable with the plurality of radial recesses 34k of the lens supporting barrel 34. The predetermined tool is released from the lens supporting barrel 34 after the lens supporting barrel 34 has been rotated by the aforementioned predetermined amount, that is, by an amount to engage each engaging projection 20c with the corresponding locking recess 34h. After the tool has been released from the lens supporting barrel 34, the lens supporting barrel 34 is biased forward along the optical axis O by the biasing force of the O-ring 81. Due to the biasing force of the O-ring 81, the engaging projections 20c and the locking recesses 34h firmly engage with one another with the front engaging portion 34e being fitted in the circular aperture 20e. It should be appreciated that the engaging projections 20c are tightly engaged with the locking recesses 34h through the biasing force of the O-ring 81 and that the precise axial position of the lens supporting barrel 34 relative to the first moving barrel 20 in the optical axis direction can be determined in an easier way than a conventional way which does not use a biasing member such as the O-ring 81.

The engaging projections 20c and the engaging recesses 34h are both formed at even angular intervals, as noted above. Due to this arrangement, the lens supporting barrel 34 can be easily engaged with the first moving barrel 20, without minding about the angular position of the lens supporting barrel 34 relative to the first moving barrel 20 when the lens supporting barrel 34 is attached thereto. Furthermore, the lens supporting barrel 34 receives an even biasing force from the O-ring 81 regardless of which engaging projection 20c engages with which locking projection 34h. The front lens group L1 is accordingly easily and precisely positioned relative to the rear lens group L2 in accordance with the structure of the present embodiment for supporting the lens supporting barrel 34 in the first moving barrel 20.

In addition, the structure of the present embodiment for supporting the lens supporting barrel 34 on the first moving barrel 20 has another merit. Namely, in the case where the front lens group L1 and the rear lens group L2 are not properly aligned along the optical axis O even though the lens supporting barrel 34 is properly attached to the first moving barrel 20, due to an imprecise assembling of components of the zoom lens barrel 10, an imprecise size of a component or components of the zoom lens barrel 10 or the like, the axial position of the front lens group L1 relative to the rear lens group L2 can be adjusted by some degree in order to obtain a proper alignment of the front and rear lens groups L1, L2 by changing the angular position of engagement of the lens supporting barrel 34 relative to the first moving barrel 20, i.e., by changing the combination of engagement of the engaging projections 20c with the locking recesses 34h. In the case where adequate alignment cannot be obtained even if the combination of engagement of the engaging projections 20c with the locking recesses 34h is changed, a component or components of the zoom lens barrel 10 which seem to be causing the inadequate alignment needs to be adjusted, while the combination of engagement of the engaging projections 20c with the locking recesses 34h may be changed at the same time, which may result in an adequate alignment of the front and rear lens groups L1 and L2.

In the above-described embodiment of the zoom lens barrel 10, although the zoom lens optical system consists of two movable lens groups, namely the front lens group L1 and the rear lens group L2, it should be understood that the present invention is not limited to the present embodiment disclosed above, but the present invention may also be applied to another type of zoom lens optical system including one or more fixed lens group.

In addition, in the above embodiment, the rear lens group L1 is provided as a component of the AF/AE shutter unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Instead of adopting such a structure, the zoom lens barrel 10 may also be realized in such a manner by making the rear lens group L2 a member separate from the AF/AE shutter unit 21, which is provided with the shutter mounting stage 40, the circular driving member 49, the supporting member 47, the shutter blades 27, the shutter blade supporting ring 46 and the like, and that the rear lens group L2 is supported by any supporting member other than the AF/AE shutter unit 21.

In the zoom lens camera of the present embodiment, the operation by rotation of the whole optical unit driving motor 25 and the rear lens group driving motor 30 will now be described with reference to FIGS. 8, 9, 10 and 11.

As shown in FIG. 9 or 11, when the zoom lens barrel 10 is at the most retracted (withdrawn) position, i.e., the lens-housed condition, when the power switch is turned ON, the whole optical unit driving motor 25 is driven to rotate its drive shaft in the forward rotational direction by a small amount. This rotation of the motor 25 is transmitted to the driving pinion 15 through a gear train 26, which is supported by a supporting member 32 formed integral with the fixed lens barrel block 12, to thereby rotate the third moving barrel 16 in one predetermined rotational direction to advance forwardly along the optical axis O. Therefore, the second moving barrel 19 and the first moving barrel 20 are each advanced by a small amount in the optical axis direction, along with the third moving barrel 16. Consequently, the camera is in a state capable of photographing, with the zoom lens positioned at the widest position, i.e., the wide end. At this stage, due to the fact that the amount of movement of the linear guide barrel 17, with respect to the fixed lens barrel block 12, is detected through the relative slide between the code plate 13a and the contacting terminal 9, the focal length of the zoom lens barrel 10, i.e., the front and rear lens groups L1 and L2, is detected.

In the photographable state as above described, when the aforementioned zoom operating lever is manually moved towards a "tele" side, or the "tele" zoom button is manually depressed to be turned ON, the whole optical unit driving motor 25 is driven to rotate its drive shaft in the forward rotational direction through the whole optical unit driving motor controller 60 so that the third moving barrel 16 rotates in the rotational direction to advance along the optical axis O via the driving pinion 15 and the outer peripheral gear 16b. Therefore, the third moving barrel 16 is advanced from the fixed lens barrel block 12 according to the relationship between the female helicoid 12a and the male helicoid 16a. At the same time, the linear guide barrel 17 moves forwardly in the optical axis direction together with the third moving barrel 16, without relative rotation to the fixed lens barrel block 12, according to the relationship between the engaging projections 17c and the linear guide grooves 12b. At this time, the simultaneous engagement of the follower pins 18 with the respective lead slots 17b and linear guide grooves 16c causes the second moving barrel 19 to move forwardly relative to the third moving barrel 16 in the optical axis direction, while rotating together with the third moving barrel 16 in the same rotational direction relative to the fixed lens barrel block 12. The first moving barrel 20 moves forwardly from the second moving barrel 19 in the optical axis direction, together with the AF/AE shutter unit 21, without relative rotation to the fixed lens barrel block 12, due to the above-noted structures in which the first moving barrel 20 is guided linearly by the linear guide member 22 and in which the follower pins 24 are guided by the lead grooves 19c. During such movements, according to the fact that the moving position of the linear guide barrel 17 with respect to the fixed lens barrel block 12 is detected through the relative slide between the code plate 13a and the contacting terminal 9, the focal length set by the zoom operation device 62 is detected.

Conversely, when the zoom operating lever is manually moved towards a "wide" side, or the "wide" zoom button is manually depressed to be turned ON, the whole optical unit driving motor 25 is driven to rotate its drive shaft in the reverse rotational direction through the whole optical unit driving motor controller 60 so that the third moving barrel 16 rotates in the rotational direction to retract into the fixed lens barrel block 12 together with the linear guide barrel 17. At the same time, the second moving barrel 19 is retracted into the third moving barrel 16, while rotating in the same direction as that of the third moving barrel 16, and the first moving barrel 20 is retracted into the rotating second moving barrel 19 together with the AF/AE shutter unit 21. During the above retraction driving, like the case of advancing driving as above described, the rear lens group driving motor 30 is not driven.

Figure 8:
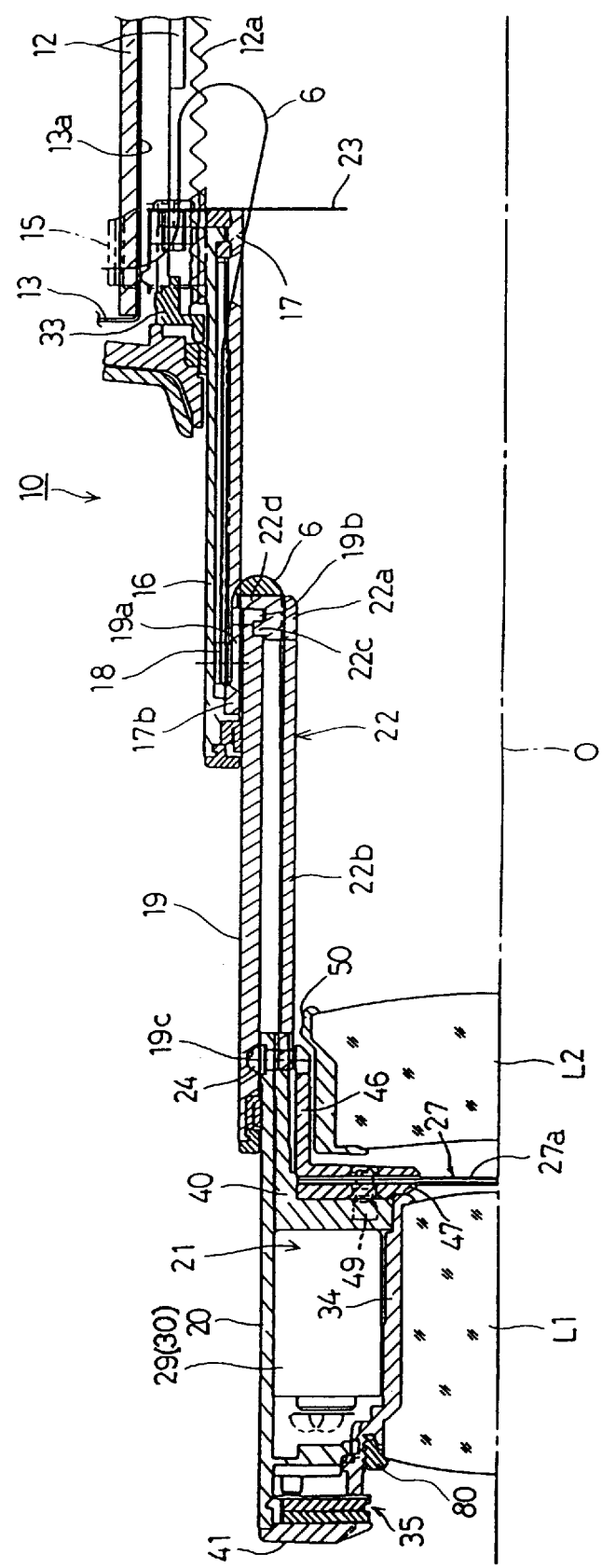
FIG. 8 is a sectional view of an upper part of the zoom lens barrel in a maximum extended state.
Figure 10:
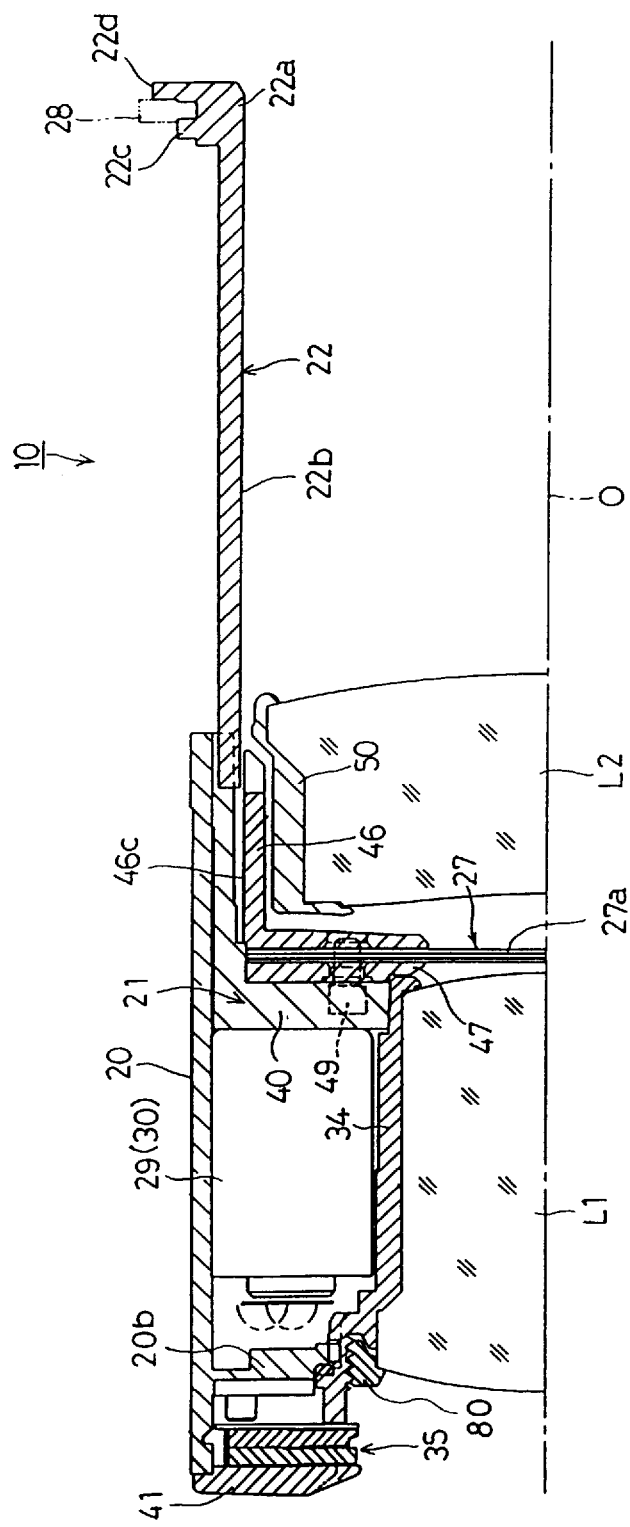
FIG. 10 is a sectional view of the upper part of the zoom lens barrel shown in FIG. 9 in the maximum extended state.

While the zoom lens barrel 10 is driven during the zooming operation, since the rear lens group driving motor 30 is not driven, the front lens group L1 and the rear lens group L2 move as a whole, maintaining a constant distance between each other, as shown in FIG. 8 or 10. The focal length input via the zoom code plate 13a and the contacting terminal 9 is indicated on an LCD panel (not shown) provided on the camera body.

At any focal length set by the zoom operating device 62, when the release button is depressed by a half-step, the object distance measuring apparatus 64 is actuated to measure a current subject distance. At the same time the photometering apparatus 65 is actuated to measure a current subject brightness. Thereafter, when the release button is fully depressed, the whole optical unit driving motor 25 and the rear lens group driving motor 30 are each driven by respective amounts dictated according to the focal length information set in advance and the subject distance information obtained from the object distance measuring apparatus 64 so that the front and rear lens groups L1 and L2 are respectively moved to specified positions to obtain a specified focal length to thereby bring the subject into focus. Immediately after the subject is brought into focus, via the AE motor controller 66, the AE motor 29 is driven to rotate the circular driving member 49 by an amount corresponding to the subject brightness information obtained from the photometering apparatus 65 so that the shutter 27 is driven to open the shutter blades 27a by a specified amount which satisfies the required exposure. Immediately after such a shutter release operation, in which the three shutter blades 27a are opened and subsequently closed, is completed, the whole optical unit driving motor 25 and the rear lens group driving motor 30 are both driven to move the front lens group L1 and the rear lens group L2 to the respective initial positions at which they were at prior to a shutter release.

In the zoom lens barrel 10 of the present embodiment, the engaging projections 20c and the locking recesses 34h are formed at even angular intervals on the first moving barrel 20 and the lens supporting barrels 34 to correspond to each other, respectively. Conversely, the engaging projections 20c and the locking recesses 34h may be formed at even angular intervals on the lens supporting barrel 34 and the first moving barrel 20 to correspond to each other, respectively. The same effect can also be expected with this arrangement.

In the present embodiment of the zoom lens barrel 10, "Fantas Coat SF-6" is used as the coating 80e. However, a different type of coating may be used as the coating 80e as long as it is waterproof and makes the circular abutting surface 80b a smooth surface to form substantially no gap between the circular abutting surface 80b and the circumferential portion fp.

Obvious changes may be made in the specific embodiment of the present invention described herein, such modifications being within the spirit and scope of the invention claimed. It is indicated that all matter contained herein is illustrative and does not limit the scope of the present invention.

What is claimed is:

1. A lens supporting structure for supporting a lens group in a lens barrel, comprising:
   a lens frame which supports said lens group;
   an outer flange formed on an outer periphery of said lens frame;
   an annular elastic member positioned on said lens frame behind said outer flange;
   an inner flange extending inwardly on an inner periphery of said lens barrel, an inner circumferential edge of said inner flange defining a circular aperture having a center coincident with an optical axis of said lens group, said lens frame being inserted in said lens barrel through said circular aperture to be positioned in said lens barrel with said annular elastic member being compressed between said outer flange and said inner flange;
   a plurality of projections formed on one of said outer periphery of said lens frame and said inner circumferential edge of said inner flange; and
   a plurality of recesses formed on the other of said outer periphery of said lens frame and said inner circumferential edge of said inner flange, said plurality of recesses respectively engaging with said plurality of projections to secure said lens frame to said lens barrel.

2. The lens supporting structure according to claim 1, wherein said annular elastic member is an O-ring.

3. The lens supporting structure according to claim 1, wherein said plurality of projections and said plurality of recesses are formed at regularly spaced angular intervals about said optical axis.

4. The lens supporting structure according to claim 1, wherein said lens barrel is a moving barrel which is driven to advance or retract into another barrel.

5. The lens supporting structure according to claim 1, wherein said inner flange comprises an annular recess formed along said inner circumferential edge of said inner flange portion at a front portion of said inner flange, said annular elastic member being positioned in said annular recess.

6. The lens supporting structure according to claim 1, wherein said lens frame comprises a plurality of radial recesses formed at a frontmost end of said lens frame at regularly spaced angular intervals about said optical axis.

7. The lens supporting structure according to claim 1, wherein each of said plurality of recesses comprises a first recessed portion into which a corresponding one of said plurality of projections is inserted in a direction of said optical axis, and a second recessed portion which prevents said corresponding one of said plurality of projections from disengaging from said first recessed portion, said second recessed portion being connected with said first recessed portion in a circumferential direction about said optical axis, so that said corresponding one of said plurality of projections positioned in said first recessed portion shifts to said second recessed portion when said lens frame is rotated about said optical axis relative to said lens barrel in a predetermined rotational directions.

8. The lens supporting structure according to claim 7, wherein said plurality of projections and said plurality of recesses are formed such that a width of said second recessed portion is greater than a width of said corresponding one of said plurality of projections in said direction of said optical axis.

9. The lens supporting structure according to claim 1, further comprising a photographic lens having a plurality of lens groups, said photographic lens including said lens supporting structure, wherein said plurality of lens groups comprises a frontmost lens group of said plurality of lens groups.

10. A lens supporting structure for supporting a front lens group of a photographic lens system in a lens barrel, comprising:

a lens frame which supports said front lens group;

an outer flange formed on an outer periphery of said lens frame;

an annular elastic member positioned on said lens frame behind said outer flange;

an inner flange formed on an inner periphery of said lens barrel and extending inwardly toward an optical axis of said front lens group, an inner circumferential edge of said inner flange defining a circular aperture having a center coincident with said optical axis of said front lens group, said lens frame being inserted in said lens barrel through said circular aperture to be positioned in said lens barrel with said annular elastic member being compressed between said outer flange and said inner flange;

a unit positioned in said lens barrel behind said inner flange, said unit comprising a rear lens group supported thereon such that said rear lens group is movable for focusing relative to said unit along said optical axis, a cylindrical space formed along said optical axis in which said lens barrel is positioned, and a supporting member which supports a rear end of said lens frame;

a plurality of projections formed on one of said outer periphery of said lens frame behind said outer flange and said inner edge of said inner flange; and a plurality of recesses formed on another of said outer periphery of said lens frame behind said outer flange and said inner edge of said inner flange, said plurality of recesses engaging with said plurality of projections to secure said lens frame to said lens barrel.

11. The lens supporting structure according to claim 10, wherein said annular elastic member is an O-ring.

* * * * *